(12) United States Patent
Aihara et al.

(10) Patent No.: US 7,358,158 B2
(45) Date of Patent: Apr. 15, 2008

(54) WAFER MACHINING ADHESIVE TAPE, AND ITS MANUFACTURING METHOD AND USING METHOD

(75) Inventors: Shin Aihara, Nagoya (JP); Hitoshi Koga, Nagoya (JP)

(73) Assignee: Mitsui Chemicals, Inc., Tokyo (JP)

( * ) Notice: Subject to any disclaimer, the term of this patent is extended or adjusted under 35 U.S.C. 154(b) by 419 days.

(21) Appl. No.: 11/003,373

(22) Filed: Dec. 6, 2004

(65) Prior Publication Data
US 2005/0153127 A1   Jul. 14, 2005

Related U.S. Application Data

(62) Division of application No. 10/181,726, filed as application No. PCT/JP01/10165 on Nov. 21, 2001, now abandoned.

(30) Foreign Application Priority Data
Nov. 22, 2000  (JP)  ............... 2000-356807

(51) Int. Cl.
*H01L 21/00* (2006.01)
(52) U.S. Cl. ............... 438/464; 438/460; 257/E23.009
(58) Field of Classification Search ............... 438/460, 438/464, 465; 428/355 R, 355 EN, 355 RA
See application file for complete search history.

(56) References Cited

U.S. PATENT DOCUMENTS

| | | | |
|---|---|---|---|
| 5,279,896 A | 1/1994 | Tokunaga et al. | |
| 5,480,842 A | 1/1996 | Clifton et al. | |
| 5,567,515 A | 10/1996 | Koga et al. | |
| 5,851,664 A | 12/1998 | Bennett et al. | |
| 6,069,219 A | 5/2000 | McCormick et al. | |
| 6,159,827 A * | 12/2000 | Kataoka et al. | 438/464 |
| 6,235,387 B1 * | 5/2001 | Bennett et al. | 428/355 AC |
| 6,451,671 B1 | 9/2002 | Yamada | |
| 6,524,701 B1 * | 2/2003 | Kondo et al. | 428/355 RA |

FOREIGN PATENT DOCUMENTS

| | | |
|---|---|---|
| EP | 0 838 086 B1 | 4/1998 |
| JP | 60-166310 A | 8/1985 |
| JP | 05-024150 A | 2/1993 |
| JP | 09-012991 A | 1/1997 |

(Continued)

OTHER PUBLICATIONS

English translation, JP 10-298514 published Feb. 26, 1999.

(Continued)

*Primary Examiner*—Michael Lebentritt
*Assistant Examiner*—Reema Patel
(74) *Attorney, Agent, or Firm*—Buchanan Ingersoll & Rooney PC

(57) ABSTRACT

An adhesive tape having an adhesive layer formed on one side of a substrate layer, which renders it possible to minimize the extent of development of chipping or fragmentation (nicks) or crack in chip when the silicon wafer, to which this tape is adhered, is cut into chips using a dicer. The adhesive layer of the tape has a storage modulus G' of 1 MPa or more at a temperature of 15 to 35° C., and preferably tan δ as represented by the ratio of a loss modulus G" to the storage modulus G' is 0.05 or less. The adhesive layer is preferably constructed principally of an olefin polymer.

4 Claims, 7 Drawing Sheets

FOREIGN PATENT DOCUMENTS

| | | |
|---|---|---|
| JP | 10-072573 A | 3/1998 |
| JP | 10-242086 A | 9/1998 |
| JP | 10-298514 A | 11/1998 |
| JP | 11-021519 A | 1/1999 |
| JP | 2000-281991 A | 10/2000 |
| JP | 2000-281992 A | 10/2000 |

OTHER PUBLICATIONS

English abstract, JP 60-166310 published Aug. 29, 1985.

* cited by examiner

WAFER MACHINING ADHESIVE TAPE, AND ITS MANUFACTURING METHOD AND USING METHOD This application is a divisional of application Ser. No. 10/181,726, filed on Jul. 22, 2002 now abandoned, which is a national stage application of PCT/JP01/10165, filed on Nov. 21, 2001, and claiming the benefit of Japanese Patent Application No. 2000-356807, filed Nov. 22, 2000, the contents of all of which are incorporated by reference.

TECHNICAL FIELD OF THE INVENTION

The present invention relates to a wafer machining adhesive tape, or a wafer processing adhesive tape, a method for manufacturing and a method for using the same.

More specifically, the present invention relates to a wafer processing adhesive tape mainly utilized to firmly retain the wafer in place during the operation of dicing the wafer into chips in the course of the semiconductor manufacture, a method for manufacturing and a method for using the same.

BACKGROUND OF THE INVENTION

Semiconductor wafers made from silicon, gallium arsenide, or germanium-silicon, etc. are processed through the circuit pattern lithography system while in the form of the wafer having large diameter, and undergo grinding on their backsides. Thereupon, the wafer is sent to the cutting (dicing) operation wherein it is cut into chips, and then to the mounting step whereby each chip is packaged in a resin molding. A wafer processing adhesive tape is employed to firmly retain wafer in place during the dicing step.

For this wafer processing adhesive tape there are employed adhesive tapes of the ultraviolet irradiation curing type or the electron beam curing type, which are capable of regulating the degree of adhesion besides the pressure sensitive adhesive tape. The use of either type poses the problem of chipping or fragmentation and crack, which develop during the operation of cutting the wafer into chips.

In case of the adhesive tape having an adhesive layer of the pressure sensitive type, or ultraviolet irradiation curing type or electron beam curing type, dicing sawdust produced from adhesive agent or from the substrate thereof happens to be often sticks to the surface of chip. Such sawdust could cause corrosion of the circuitry in the chip or deterioration of the bond between the chip and the resin molding so far as it causes failure of chips.

Moreover, the wafer processing adhesive tape having an adhesive layer of the pressure sensitive type, or the ultraviolet irradiation curing type or the electron beam curing type poses such problem that its service life is short because of its inferior fabrication phase stability and long-term storage stability, which problem necessitating well-managed workshop environments, transportation and storage conditions. With the wafer processing adhesive tapes of these kinds, once deterioration of the adhesive layer progressed due to some unstable factors in the manufacturing conditions or storage conditions, there used to take place production of massive quantities of off-quality chips due to qualities of the wafer processing adhesive tape.

Additionally, as regards the method for manufacturing wafer processing adhesive tapes of the pressure sensitive type, or the ultraviolet irradiation curing type or the electron beam curing type, it is the conventional practice to apply an adhesive preparation dissolved in a solvent on a substrate film, which has been manufactured beforehand and has undergone surface treatment, and evaporate the solvent. Said method charges a great ecological burden on the environment due to the use of organic solvent when applying the preparation and consumption of much energy for evaporating the solvent. Worse still, it ends up with a higher cost.

On the other hand, there is known a method for preventing chipping or partial fragmentation (hereinafter referred to as "nicks" or "nick") and crack in the wafer processing operation which depends on wax to fix the wafer firmly in place for cutting it into chips. This method is, however, accompanied by very low productivity, so that it is not employed conventionally in the semiconductor industry for processing those wafers on which circuit patters have been already formed except when brittle wafers are processed or the wafer surface is required to be finished with high precision.

As a method for preventing breakage of chips due to spread of nick or crack, there is disclosed in Japanese Laid-open Patent Application No.1993-335411 a method for manufacturing semiconductor chips which comprises grinding wafer on its backside after cutting kerfs to specific depths from the front side of the wafer. There is disclosed in Japanese Laid-open Patent Application No.2000-68237 adoption of a sheet having an adhesive layer having a modulus of $1.0 \times 10^5$ Pa or more at a temperature of 40° C. as the surface protection sheet to be utilized in cutting the wafer into separate chips by grinding the backside of the wafer after having formed kerfs having depths shallower than the thickness of the wafer from the front side of the wafer on which circuit patterns have been formed. Nevertheless, it does not clearly teach the sizes of such nick and crack that would conceivably develop in the chip during the grinding operation.

Japanese Laid-open Patent Application No.1998-242086 discloses a retention sheet provided with an adhesive layer having a storage modulus of $3 \times 10^6$ to $1 \times 10^{10}$ dyne/cm² in the temperature range of 0 to 10° C. The effect of oppressing nick and crack development was evaluated merely under such very mild conditions that IC chips having nick or crack of 75 µm or less caused in the dicing operation would be rated acceptable.

Obviously, there has been available no such wafer processing adhesive tape that would be capable of minimizing the sizes of nick and crack which develop during the wafer processing to a level comparable to the one achieved according to the wax-fixing method.

Japanese Patent Publication No.1991-39524 discloses a specific α-olefin copolymer having a dynamic modulus E' of $3 \times 10^7$ to $5 \times 10^9$ dyne/cm² as determined at a temperature of 25° C. and a loss coefficient tan δ of 0.4 or more which it claimed to demonstrate vibration damping properties when said copolymer is laminated with a metal, although there appears no description of its specific uses as to the wafer processing adhesive tape.

Moreover, Japanese Laid-open Patent Application No. 1995-23354, No.1998-298514, No.1999-43655, No.1999-21519, and No.1999-106716 each disclose surface protection films incorporating specific α-olefin copolymer in their adhesive layers, although there appear no description about wafer processing adhesive tape on which severe requirements are imposed with respect to their in-service properties.

DESCRIPTION OF THE INVENTION

The present inventors, as a fruit of their strenuous research efforts to resolve the aforementioned problems, have found that internal stress and vibrations which are generated in the course of the wafer processing may be mitigated extensively by fixing in place the wafer by means of attaching the wafer to the adhesive tape with such adhesive layer interposed in between that has a specific modulus within a certain wafer processing temperature range, or furthermore a specific tan δ within said temperature range. And, the present inventors have arrived at the present invention, having found the possibility of lessening and reducing the sizes of nick and crack in the wafer to the level never achieved before with the conventional wafer processing adhesive tape.

Accordingly it is an object of the present invention to provide such wafer processing adhesive tape that is capable of decreasing the sizes of nick and crack and also oppressing the development thereof in the course of cutting the wafer into chips. It is a further object of the present invention to provide such wafer processing adhesive tape that is capable of mitigating contamination of the chip without utilizing any special equipment, possesses long-term storage stability and is constructed of such raw materials that would not create much ecological burden.

It is another object of the present invention to provide such method for manufacturing wafer processing adhesive tape that gives stable product qualities and is capable of minimizing quantities of by-produced harmful materials and/or wastes or energies consumed in the production line, which conditions serving to make such manufacturing process to be adapt to the environments.

It is another object of the present invention to provide a method for using the wafer processing adhesive tape to the extent that its properties can be fully exploited.

Namely, the present invention relates to a wafer processing adhesive tape having an adhesive layer on one side of a substrate layer, which enables a silicon wafer of a 6-inch diameter adhered to said adhesive layer and ground on its backside to a 400 μm thickness to achieve production of chips having a maximum length of chipping or fragmentation (nicks) or crack of 30 μm or less by a ratio of 90% or higher as compared with a total number of chips obtained from a silicon wafer, when the silicon wafer is cut into 3 mm square size by full cutting using a dicer at a temperature of 15 to 35° C. and under conditions of a dicing speed of 70 mm/min. and cutting water maintained at a temperature of 20° C.

The wafer processing adhesive tape, wherein the maximum length of said chipping or fragmentation (nicks) or crack of the chip is 10 μm or less, represents a preferred embodiment of the present invention.

The present invention relates to a wafer processing adhesive tape comprising an adhesive tape having an adhesive layer on one side of a substrate layer, wherein a storage modulus G' of its adhesive layer at a temperature of 15 to 35° C. is 1 MPa or more.

The wafer processing adhesive tape, wherein said adhesive layer has a tan δ of 0.05 or more as a ratio of a loss modulus G" to the storage modulus G' at a temperature of 15 to 35° C., represents a preferred embodiment of the present invention.

The wafer processing adhesive tape, wherein said adhesive layer comprises an olefin polymer as its principal component, represents another preferred embodiment of the present invention.

The wafer processing adhesive tape, wherein said adhesive layer comprises as its principal component one type or a mixture of two or more types of α-olefin copolymer comprising as its principal unit components at least two types of α-olefin selected from among α-olefins having from 2 to 12 carbon atoms, also represents another preferred embodiment of the present invention.

The wafer processing adhesive tape, wherein said adhesive layer comprises of said α-olefin copolymer, a thermoplastic elastomer and a co-oligomer of ethylene with another α-olefin, and the α-olefin copolymer constitutes a continuous phase and the thermoplastic elastomer constitutes a dispersed phase, represents another preferred embodiment of the present invention.

The wafer processing adhesive tape, wherein said thermoplastic elastomer is a block copolymer represented by the formula of A-B-A or A-B, wherein A is an aromatic vinyl compound polymer block or an olefin polymer block exhibiting crystallinity, B is a diene compound polymer block or an olefin polymer block derived by hydrogenating the diene compound polymer block, represents another preferred embodiment of the present invention.

The wafer processing adhesive tape, wherein one type of said α-olefin copolymer is preferably an α-olefin copolymer derived by copolymerizing propylene, 1-butene and an α-olefin having from 5 to 12 carbon atoms, and said α-olefin having from 5 to 12 carbon atoms is preferably 4-methyl-1-pentene, each represents another preferred embodiment of the present invention.

It is preferable that the substrate layer comprises of one or more layers and comprises as its principal component an olefin polymer.

The wafer processing adhesive tape, wherein said adhesive tape exhibits a probe tack in the range of 0.01 to 1 N/5 mm diam. as measured in a temperature range of 20 to 80° C. in accordance with the procedure stipulated in the reference column of JIS Z0237, represents another preferred embodiment of the present invention.

It is preferable that the wafer processing adhesive tape has its substrate layer and adhesive layer formed according to a co-extrusion process.

The present invention, furthermore, relates to a method for manufacturing a wafer processing adhesive tape having a substrate layer comprising of one or more layers and an adhesive layer laminated over one side of such substrate layer, comprising a co-extrusion process using a multilayer die, wherein melt flow rate (MFR) (ASTM D 1238, as determined at 230° C. under a load of 2.16 kg) of the polymer constituting the substrate layer and the adhesive layer is 5 to 40 g/10 min. and the difference in MFR between the adjoining layers is 10 g/10 min. or less, and operating conditions of which being such that melting temperature is 200 to 260° C. and the difference in the melting temperature between the adjoining layers is 30° C. or less.

The present invention also relates to a method for using wafer processing adhesive tape, comprising adhering a wafer processing adhesive tape described before to a wafer under a load at a temperature of 20 to 80° C., cutting the wafer into chips at a temperature of 15 to 35° C., stretching said tape at a temperature of 40 to 80° C. and thereupon peeling the chips from the adhesive tape by picking up the same at room temperature.

The method for using wafer processing adhesive tape, wherein the wafer is a wafer on whose front surface has been formed circuit patterns and said cutting is performed by dicing, represents a preferred embodiment of the present invention.

DESCRIPTION OF THE PREFERRED EMBODIMENTS

A wafer processing adhesive tape of the present invention (hereinafter referred to as "the Adhesive Tape of the present invention"), the method for manufacturing the same (hereinafter referred to as "the Manufacturing Method of the present invention"), and the method for using the same (hereinafter referred to as "the Method for Using of the present invention") will be explained in detail with reference to the attached drawings as follows.

Identical or corresponding parts referred to in Figures shall be identified with identical code numbers, respectively.

Figure 1:
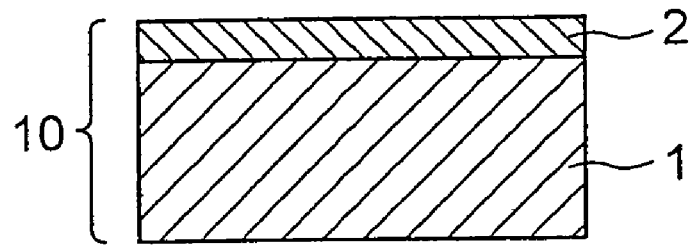
FIG. 1 shows a sectional view of wafer processing adhesive tape of the present invention illustrating a mode of embodiment thereof.

FIG. 1 shows a sectional view illustrating a mode of embodiment of the Adhesive Tape of the present invention.

As the figure illustrates, the Adhesive Tape 10 of the present invention comprises of a substrate layer 1 and an adhesive layer 2 which is laminated on one side of the substrate layer 1.

There are no particular limitations to the components of the substrate layer 1. Various thin layer materials, such as plastics, paper, metal foils, natural resins, etc. may be used. Above all, non-halogen-derived plastics are preferred for the present invention for the reason of their water resistance, heat resistance and ease of waste disposal. There can be cited as specific examples thereof olefin polymer, polyamide, polyester, polyether, polycarbonate, polyurethane, etc. In particular, the preferred ones are those plastics composed of carbon, hydrogen and oxygen which do not generate toxic gas such as sulfur oxides, nitrogen oxides or halogen compound represented by dioxin in the course of post-use disposal by incineration, that is to say, plastics whose ecological burden is relatively small.

As for the substrate layer 1, what is particularly preferred for use as its component is a material whose principal component is olefin polymer in view of its versatile properties to satisfy such requirements as the strength to retain the wafer in place, the post-cutting (i.e., after the wafer has been cut (diced) into IC chips) stretchability, productivity (as the substrate film), storage stability, etc. and the ability to impart additional properties when combined with another material, its adaptability to ecological requirements, the ease of achieving strong bond between a plurality of layers.

There is no particular limitation to the type of olefin polymer. It may be a polymer comprising α-olefin as the compositional unit which may be α-olefin homopolymer or copolymer of different α-olefins, or copolymer of α-olefin with vinyl monomer, etc. There can be cited specific examples of such olefin polymer as follows.

(1) Ethylene Polymer

Low-density polyethylene, ultra low-density poly-ethylene, linear low-density polyethylene, medium density polyethylene, high-density polyethylene, ultra-high molecular weight polyethylene.

Copolymers of ethylene with α-olefin having from 3 to 12 carbon atoms, various vinyl compounds such as styrene, vinyl acetate, (meth)acrylic acid, (meth)acrylic ester, and maleic acid.

Copolymers, conventionally called "Ionomers", comprising ethylene-(meth)acrylic acid copolymer to whose side chain is bonded by ionic bonds crosslinked polymer containing metal ion such as Zn, Na, K ions, etc.

(2) Propylene Polymer

Propylene homopolymer, propylene-ethylene block copolymer, propylene-ethylene random copolymer, propylene-ethylene-butylene block copolymer, propylene-ethylene-butylene random copolymer, and ultrahigh molecular weight polypropylene.

Copolymers of propylene with α-olefin having from 4 to 12 carbon atoms, various vinyl compounds such as styrene, vinyl acetate, (meth)acrylic acid, (meth)acrylic ester, etc. and maleic acid.

(3) α-Olefin polymer having 4 or more carbon atoms

Poly-1-butene, poly-4-methyl-1-pentene, ultrahigh molecular weight poly-1-butene, and ultrahigh molecular weight poly-4-methyl-1-pentene.

Copolymers of α-olefin having 4 or more carbon atoms with another α-olefin, or various vinyl compounds such as styrene, vinyl acetate, (meth)acrylic acid, (meth)-acrylic ester, and maleic acid, etc.

The principal component as used in the present invention means the compositional element which is contained by a relatively high ratio as compared with other compositional element contained.

In cases where the substrate layer is constructed of two or more multiple layers, those layers may be so composed that the respective layers will be responsible for specific properties required of the wafer processing adhesive tape. There may be cited as such mode of embodiment that an intermediate layer may be endowed with stretchability or tear resistance in the course of the wafer processing and weatherability realized by adding a weathering stabilizer and that the outermost layer may be endowed with resistance to surface injury and peelability from the adhesive layer to the extent that a wound-up protective film may be readily rewound. Adjoining layers may be constructed of any material so long as they are adhered firmly to each other according to a melt co-extrusion process. A preferred embodiment is such that the principal component of the adhesive layer and the outermost layer (the surface layer) on the opposite side is an ethylene copolymer.

Figure 2:
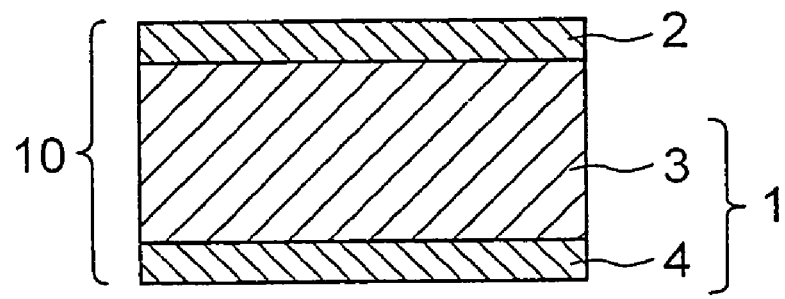
FIG. 2 shows a sectional view of wafer processing adhesive tape of the present invention illustrating another mode of embodiment thereof.

FIG. 2 shows a sectional view of the Adhesive tape of the present invention, which illustrates another embodiment thereof. As this Figure shows, the Adhesive Tape 10 of the present invention comprises the substrate layer 1 comprising of an intermediate layer 3 and a surface layer 4 and the adhesive layer 2 which is laminated onto one side of the intermediate layer 3.

It is preferable that the intermediate layer comprises as its principal component an olefin polymer. It is furthermore preferable that the intermediate layer is composed of said olefin polymer and a thermoplastic elastomer, wherein the olefin polymer constitutes a continuous phase and the thermoplastic elastomer does a dispersed phase. It is by way of realizing the aforementioned provision that the strength to fix the wafer in place without causing any sag may be enhanced and at the same time the kerf cut to a midway depth of the intermediate layer is not enlarged in the course of the wafer processing and the kerf is not torn apart when the tape is stretched after the wafer processing there is not caused any sag (so-called "necking"). It is another feature that the chip-to-chip gap (the distance between kerfs) is evenly and sufficiently stretched in both the longitudinal and transverse directions of the chip.

Any olefin polymers similar to said polymer may be used.

As examples of thermoplastic elastomer, there can be cited polystyrene elastomer, polyolefin elastomer, polyamide elastomer, polyurethane elastomer, polyester elastomer, etc. Among those elastomers cited above, polystyrene elastomer, polyolefin elastomer, and polyester elastomer are preferred for the reason that they are such thermoplastic elastomers composed of carbon, hydrogen and oxygen that do not generate toxic gas such as sulfur oxides, nitrogen oxides or halogen compounds represented by dioxins, that is to say, ecologically less burdensome.

Among all, particularly preferred are block copolymers represented by the formula A-B-A or A-B (wherein "A" is an aromatic vinyl compound polymer block or an olefin polymer block exhibiting crystallinity, and "B" is a diene compound polymer block or olefin polymer block derived by hydrogenating the same) for the reason that they facilitate production of a phase dispersed in the continuous phase formed by said olefin polymer.

What can be cited as examples of the polystyrene elastomer are a block copolymer comprising polystyrene as the rigid portion (the crystalline portion) and polymer block formed from diene compound monomer or a polymer block derived by hydrogenating the same as the soft portion. More specifically, there can be exemplified styrene-isoprene-styrene block copolymer (SIS), styrene-butadiene-styrene block copolymer (SBS), styrene-ethylene-butylene-styrene block copolymer (SEBS), styrene-ethylene-propylene-styrene block copolymer (SEPS), etc. They may be used alone or in a combination of two or more types.

Examples of said polyolefin elastomer are block copolymers composed of polyolefin block constituting a highly crystalline polymer as the rigid portion such as polyethylene, polypropylene, etc. and a copolymer block exhibiting non-crystallinity as the soft portion. As specific examples of such block copolymer, there can be cited olefin polymer chain (crystalline)-ethylene-butylene copolymer chain (non-crystalline)-olefin polymer chain (crystalline) block copolymer; polypropylene-polyethylene oxide-polypropylene block copolymer; polypropylene-polyolefin (non-crystalline)-polypropylene block copolymer; styrene polymer chain-ethylene-butylene copolymer chain (noncrystalline)-olefin polymer chain (crystalline) block copolymer, etc.

What can be cited as a specific example of said polyester elastomer is polybutylene terephthalate-polyether-polybutylene terephthalate block copolymer.

Figure 3:
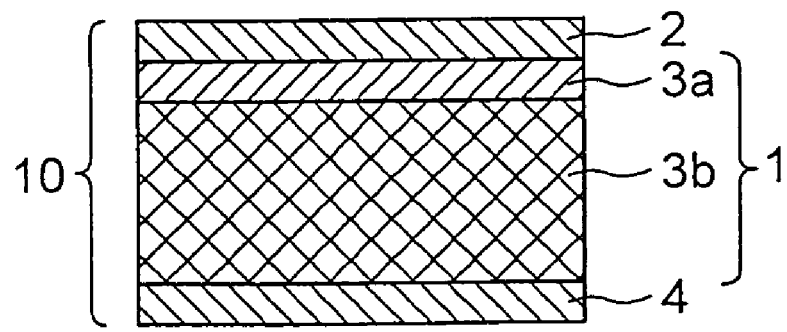
FIG. 3 shows a sectional view of wafer processing adhesive tape of the present invention illustrating another mode of embodiment thereof.

FIG. 3 shows a sectional view of the Adhesive Tape of the present invention illustrating its another mode of embodiment. As the Figure shows, the Adhesive Tape 10 of the present invention comprises the substrate layer 1 onto which are laminated a first intermediate layer 3a, a second intermediate layer 3b, and the surface layer 4 in said order and the adhesive layer 2 laminated on one side of the first intermediate layer 3a.

In cases where the substrate layer 1 is constructed of three layers, a preferred embodiment of the present invention is such that either one or both of the first intermediate layer 3a and the second intermediate layer 3b is/are the olefin polymer constituting the continuous phase and the thermoplastic elastomer constituting the dispersed phase. In such cases, a more preferred mode of embodiment is such that the second intermediate layer 3b comprises the olefin polymer constituting the continuous phase and the thermoplastic elastomer constituting the dispersed phase. In this connection, the thickness of the first intermediate layer 3a is, for example, 10 to 200 µm, and preferably 30 to 150 µm. The thickness of the second intermediate layer 3b is, for example, 1 to 100 µm, and preferably 5 to 50 µm.

The intermediate layer of the substrate layer adjoining the adhesive layer (the first intermediate layer 3a in FIG. 3) may contain as its principal component either one type alone or a mixture of two or more types of said α-olefin containing polymer(s). The intermediate layer adjoining the adhesive layer may include, in addition to the α-olefin containing polymer, as an auxiliary component a resin having in its molecular structure such functional groups as oxygen atom-containing group other than hydrocarbon unless the included group bleeds out and adversely affects the adhesive layer.

Said α-olefin containing polymer in the intermediate layer adjoining said adhesive layer may be contained typically by a ratio of 50 to 100% by weight, and preferably 70 to 100% by weight.

The principal component of the surface layer 4 constituting the outermost layer of the substrate 1 in the Adhesive Tape of the present invention is preferably an olefin polymer. Among all, ethylene-(meth)acrylic acid copolymer is suitable. In such case, the ratio by which said ethylene-(meth)acrylic acid copolymer is contained in the surface layer 4 constituting the outermost layer of the substrate layer 1 is typically 50 to 100% by weight, and preferably 70 to 100% by weight. As an example of components other than the principal component there can be cited α-olefin (co)polymer.

Preferred as the principal component of the surface layer are such composition that contains as the principal component a mixture consisting of said ethylene-(meth)acrylic acid copolymer, polyethylene and a metal ion crosslinked resin derived from such ethylene-(meth)acrylic acid copolymer, or a mixture of said α-olefin-containing polymer and a small quantity of a reaction product of polyvinyl alcohol or ethylene-vinyl alcohol copolymer and a long-chain alkyl isocyanate (release agent), etc. There may be obtained an adhesive tape having a rewinding force of 5 N/25 mm or less.

In cases where the surface layer 4 which constitutes the outermost layer of the substrate layer 1 of the Adhesive Tape of the present invention is a layer comprising ethylene-(meth)acrylic acid copolymer and a metal ion crosslinked resin derived from such ethylene-(meth)acrylic acid copolymer, it is preferable that the metal ion crosslinked resin derived from ethylene-(meth)acrylic acid copolymer is contained by 1 to 50% by weight, and particularly 3 to 40% by weight.

In cases where the surface layer 4 which constitutes the outermost layer of the substrate layer 1 of the Adhesive Tape of the present invention comprises as its principal component an α-olefin-containing polymer, it is preferable to add such release agent as a small amount of a reaction product of polyvinyl alcohol or ethylene-vinyl alcohol copolymer and a long-chain alkyl isocyanate, etc. The suitable ratio by which said release agent is contained is typically 0.5 to 20% by weight, and particularly 1 to 10% by weight of the surface layer of the substrate layer 1.

The substrate layer 1 may contain various additives conventionally used for the substrate of the wafer processing adhesive tape of this kind. For example, it may contain various fillers, pigments, ultraviolet absorbers, antioxidants, heat stabilizers, lubricants, etc. to an extent not affecting the wafer processing or chips.

The thickness of the substrate 1 of the Adhesive Tape of the present invention is preferably 10 to 200 μm, and more preferably 30 to 150 μm from the viewpoints of injury preventable properties, efficiency in the adhering job, and pricing. In cases where the substrate consists of an intermediate layer and a surface layer, the thickness of the intermediate layer is preferably 10 to 200 μm, and more preferably 30 to 150 μm. The thickness of the surface layer is preferably 1 to 100 μm, and more preferably 5 to 50 μm.

The Adhesive Tape of the present invention is a multi-layered laminated film constructed of two or more layers consisting of a substrate layer and an adhesive layer laminated onto one side of said substrate layer. A 6 inch-diameter silicon wafer whose backside has been ground to a 400 μm thickness as the adherend is attached to the wafer processing adhesive tape with the adhesive layer interposed in between. Thereupon, said wafer is cut into 3 mm by 3 mm square size chips by the dicing saw at a dicing speed of 70 mm/min. and at a cutting water temperature of 20° C. in an atmosphere maintained in the range of 15 to 35° C. In the course of said wafer processing step, what can be achieved with the Adhesive Tape of the present invention is a ratio of 90% or more in terms of [the number of chip having a nick or crack in the length of 30 μm maximum, and preferably 10 μm or less, which possibly develops on the surface of the processed chip] to [the total number of chips processed]. So long as this level is maintained, there is hardly produced any rejectable chip due to nick or crack during the wafer processing, and thus may be achieved product qualities close enough to those realized according to the wax-fixing method.

While the percent off-quality chips production in the dicing step varies with the tolerable maximum length of nick or crack that is apt to be modified liberally, it is an essential consideration to establish a standard for nick or crack such that the applicable standard would not affect the objective status of the ultimately assembled product. On the other hand, from the productivity point of view, the percent defect-free products is typically required to be 90% or higher, and preferably 95% or higher, and more preferably 99% or even much closer to 100%, although zero defect production is an ideal goal.

The Adhesive Tape of the present invention is able to achieve 90% or higher as the ratio of the number of acceptable chips to the total number of chips produced even if the lower limit of the acceptable quality is set at as high as 30 μm or less, and preferably 10 μm or less, for the nick or crack in chip. The standard and percent acceptable chips adopted for the present invention fulfill both the product reliability and productivity required of the semiconductor products to serve under severe environmental conditions, such as mobile electronic equipment, IC cards, etc.

The maximum length of nick or crack in the chip was determined in the present invention in accordance with the following procedure. A 6 inch-diameter P-type silicon mirror wafer is prepared by grinding the backside thereof to a 400 μm thickness to the finished surface roughness of #2000 at a temperature of 23° C. and in atmosphere controlled to relative humidity (RH) of 50%. The wafer was fixed firmly onto a frame, for example, MDFTF-2-6-1-H manufactured by Disco Corp., by attaching its mirror surface to the frame using a wafer mounter equipped with a temperature regulating device, for example, HS-7800 manufactured by Hugle Electronics Co., using the wafer processing adhesive tape, at such temperature level not liable to give rise to chip fly, for example, a temperature selected from the range of 20 to 80° C. Thereupon, the wafer is fully cut to a 30 μm depth by a stroke of a dicing saw, for example, DAD320 manufactured by Disco Corp., using a diamond cutter blade, for example, NBC-ZH2050 (size: 27HEDD) manufactured by Disco Corp., at a specific processing speed, for example, at a cutting blade revolving speed of 30,000 rounds per min. and a cutting speed of 70 mm/min. with cooling and washing using cutting water maintained at a temperature of 20° C. using a temperature-regulating device. It is through execution of said procedure to cut the wafer into oblong chips, for example, each size being 3 mm square, that the length of such nick or crack is measured.

An example of such test procedure is explained with reference to drawings.

Figure 9:
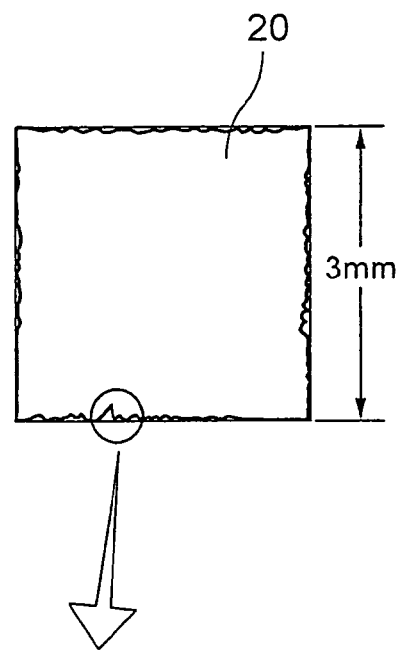
FIG. 9 consists of the upper drawing which shows the IC chip as viewed from the adhesive tape side and the lower drawing which shows an enlarged conceptual view illustrating nick and crack that developed in a chip.
Figure 9:
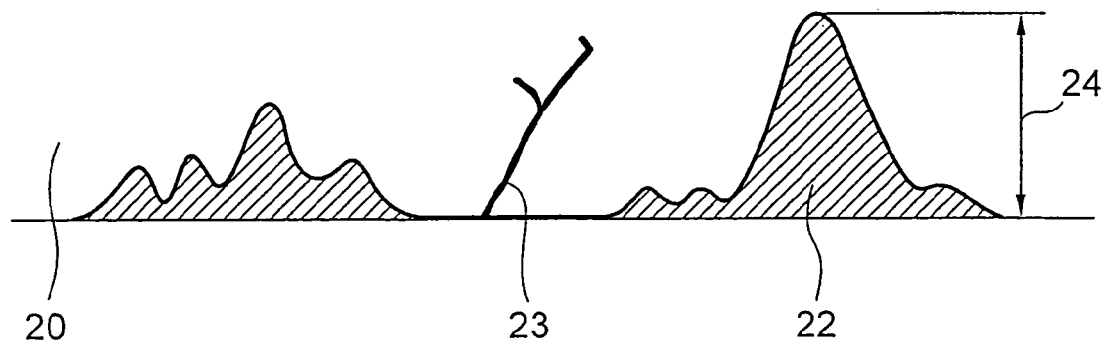

The upper drawing in FIG. 9 shows an exterior view of the chip 20 obtained by cutting a silicon wafer into 3 mm square size chips as viewed from the adhesive tape side. The lower drawing in FIG. 9 is an enlarged conceptual view of the nick 22 or crack 23 which has developed on the straight line ground surface of the IC chip 20 as viewed from the adhesive tape side. The nick 22 shows by oblique lines the part chipped off from the chip in oblique lines, while the crack 23 that developed in the chip is shown by solid lines.

Figure 10:
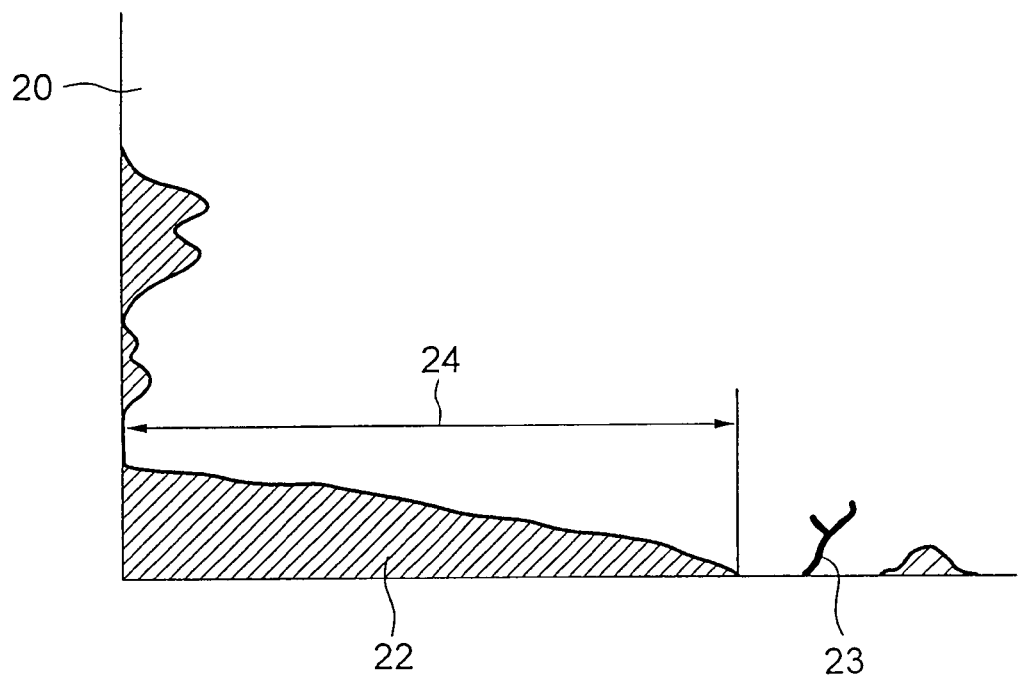
FIG. 10 shows an enlarged conceptual view of a chip as viewed from the adhered surface illustrating nick or crack that developed in a corner section of a chip.
Figure 11:
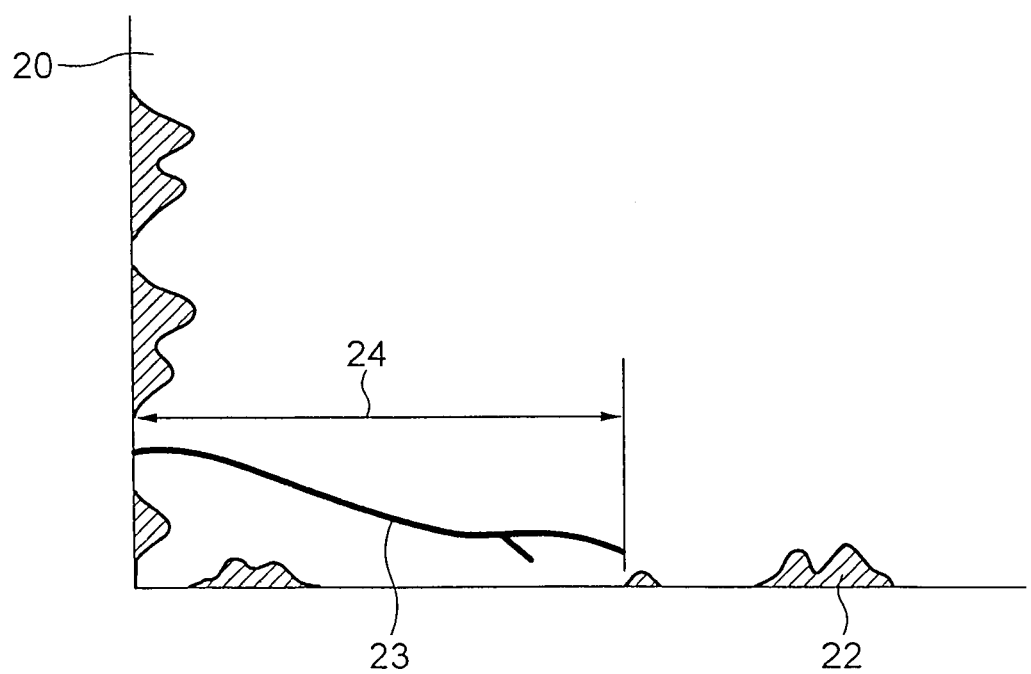
FIG. 11 shows an enlarged conceptual view of a chip as viewed from the adhered surface illustrating nick or crack that developed in a corner part of a chip.

FIG. 10 and FIG. 11 are schematic diagrams showing enlarged views of the nick 22 or crack 23 that have developed on the surface at a cut corner of the chip 20 as viewed from the adhesive tape side. In the course of cutting the corner section of the wafer, there prevails a strong tendency of the nick or crack to be maximized, since the route of cutting oriented in the perpendicular direction to the plane of the silicon wafer cuts across the longitudinal direction on the surface of the wafer assuming the vertical angle in relation to the plane of the wafer.

FIG. 10 shows an example of a nick 22 assuming the oblong figure in a corner section, wherein is illustrated the maximum nick length 24 of the nick 22 of the chip 20. The nick is evaluated with respect to the distance from the planes of cutting in both the longitudinal direction and the transverse direction in the chip 20, and the longer distance is reported as the maximum length 24 of the nick 22.

FIG. 11 shows a continuous crack of the crack 23 in a corner section, which illustrates an example of the maximum crack length 24 of the chip 20. The crack is evaluated with respect to the distance from the planes of cutting in both the longitudinal direction and the transverse direction in the chip 20, and the longer distance is reported as the maximum length of crack 24 of the crack 23.

The adhesive layer 2 of the Adhesive Tape of the present invention has a storage modulus G' of 1 MPa or more, and preferably 1 to 200 MPa in the range of 15 to 35° C. which is the ambient temperature for wafers processed. It is, furthermore, desirable that the ratio of the loss modulus G" to the storage modulus G' as represented by tan δ is in the range of 0.05 or more. Under such conditions, amplification of the internal stress in the wafer which is attributed to the resonance caused by the rotary blade can be mitigated and thus may be minimized the percent nick or crack development in the chip and at the same time the size of nick and crack may be minimized.

The adhesive layer 2 of the Adhesive Tape of the present invention is preferably the one which is laminated on one side of said substrate layer 1 and contains as its principal component an olefin polymer. It is furthermore preferable that its principal component is one type or a mixture of two or more types of α-olefin copolymer comprising as its/their principal component(s) at least two types of α-olefin selected from among α-olefins having from 2 to 12 carbon atoms. Particularly preferred among them is the one comprising said α-olefin copolymer, a thermoplastic elastomer and a co-oligomer of ethylene with another α-olefin, wherein the α-olefin copolymer constitutes a continuous phase and the thermoplastic elastomer does a dispersed phase.

Figure 13:
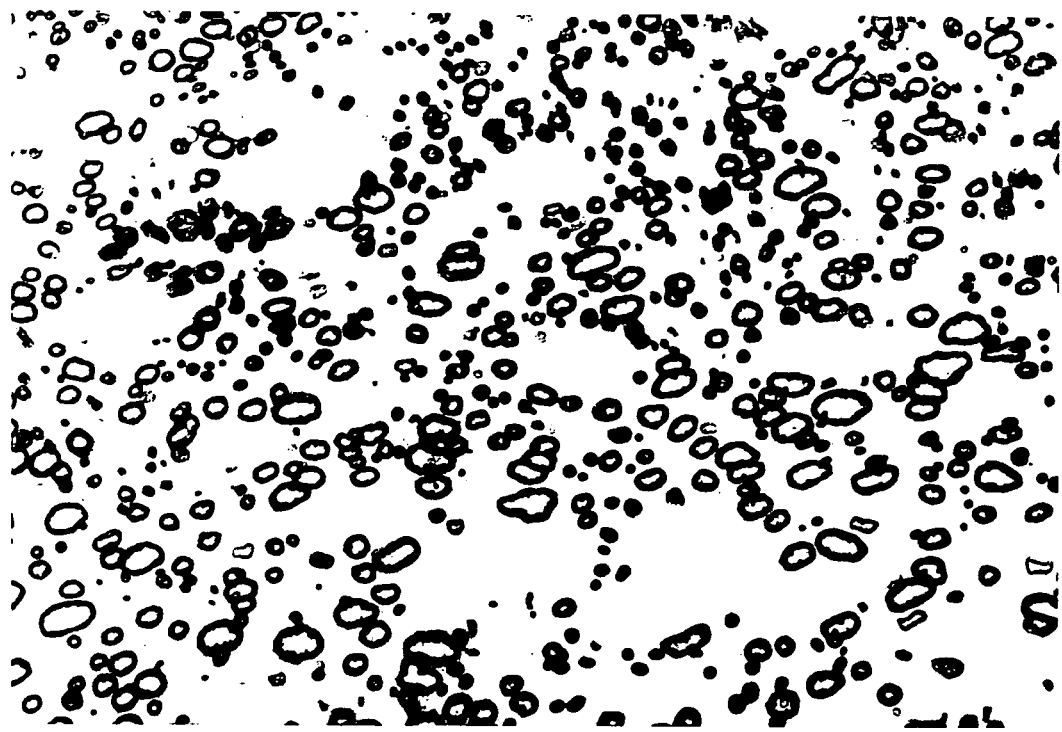
FIG. 13 is an electron micrograph of a cross section of the adhesive layer assuming the transverse direction to its flow direction.
Figure 14:
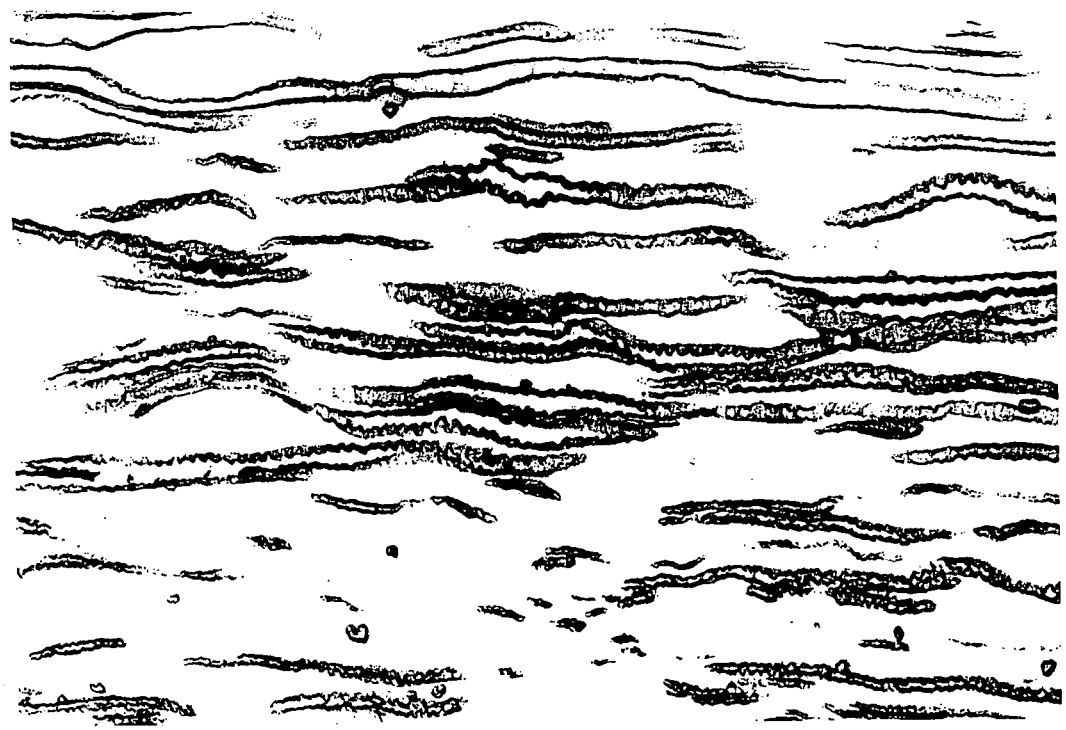
FIG. 14 is an electron micrograph of a cross section of the adhesive layer assuming the parallel direction to its flow direction.

Said phase formations are obviously seen from FIGS. 13 and 14, respectively, which are photographs showing the cross section of the adhesive layer. FIG. 13 shows a cross section assuming the vertical angle to the flow direction of the adhesive layer, and FIG. 14 shows a cross section assuming the parallel angle to the flow direction of the adhesive layer. It is on account of said provision that the glass transition temperature of the adhesive layer declines and thus may be achieved tight adhesion free of air pockets between the Adhesive Tape of the present invention and the wafer even at lowered application temperatures, and furthermore the initial adhesion strength indicated by the probe tack may be adjusted to within an optimum range. In other words, the adhesive properties at moderate temperatures may be improved. Additionally, owing to the continuous layer formed with α-olefin copolymer, an adhesive layer having a high storage modulus G' and tan δ may be obtained.

As examples of α-olefin having from 2 to 12 carbon atoms, there can be cited ethylene, propylene, 1-butene, 1-pentene, 3-methyl-1-butene, 1-hexene, 4-methyl-1-pentene, 3-methyl-1-pentene, 1-heptene, 1-octene, 1-decene, 1-dodecene, etc. In cases where a copolymer produced from at least two types of monomers selected from among the above-named compounds is incorporated as the principal component of the adhesive layer 2, it is preferable that its total content in the adhesive layer 2 is typically 30% by weight or more, and particularly 50% by weight or more.

What is preferred for the adhesive layer is the one which comprises a copolymer derived by copolymerizing propylene, 1-butene and α-olefin having from 5 to 12 carbon atoms out of all those α-olefin copolymers named above. The adhesive layer comprising a copolymer having as its structural units 10 to 85 mol. % of propylene, 3 to 60 mol. % of 1-butene and 10 to 85 mol. % of α-olefin having from to 12 carbon atoms is preferred for the reason that it exhibits excellent adhesive properties at or in the vicinity of room temperature. The adhesive layer containing a copolymer having as its structural units 15 to 70 mol. % of propylene, 5 to 50 mol. % of 1-butene and to 70 mol. % of α-olefin having from 5 to 12 carbon atoms is furthermore preferred. For the α-olefin having from 5 to 12 carbon atoms, 4-methyl-1-pentene is preferred.

In cases where the copolymer derived by copolymerizing propylene, 1-butene and α-olefin having from 5 to 12 carbon atoms is contained in the adhesive layer, the ratio by which such copolymer is contained in the adhesive layer is typically 20% by weight or more, and more preferably 30% by weight or more.

As specific examples of said thermoplastic elastomer, there can be cited polystyrene elastomer, polyolefin elastomer, polyamide elastomer, polyurethane elastomer, and polyester elastomer, etc.

The preferred structure of said thermoplastic elastomer is the one for which the block copolymer as its structural element is represented by the formula of A-B-A or A-B. Wherein "A" is an aromatic vinyl compound polymer block or olefin polymer block exhibiting crystallinity and "B" is a diene compound polymer block or an olefin polymer block derived by hydrogenating the same.

For the polystyrene elastomer, there can be cited block copolymer produced with a polystyrene block constituting the rigid (crystalline) portion and a diene compound polymer block or a hydrogenated polymer block thereof constituting the soft portion. More specifically, some examples thereof are styrene-isoprene-styrene block copolymer (SIS), styrene-butadiene-styrene block copolymer (SBS), styrene-ethylene-butylene-propylene-styrene block copolymer (SEBS) and styrene-ethylene-propylene-styrene block copolymer (SEPS), etc. Those exemplified copolymers are used either alone or in a combination of two or more types.

Styrene-isoprene-styrene block copolymer, for example, contains a styrene polymer block having an average molecular weight of 12,000 to 100,000 and an isoprene polymer block having an average molecular weight of 10,000 to 300,000. The ratio of the styrene polymer block to the isoprene polymer block contained in this SIS is typically 5 to 50/50 to 95 by weight, and preferably 10 to 30/70 to 90.

The styrene-ethylene-propylene-styrene block copolymer is derived by hydrogenating styrene-isoprene-styrene block copolymer. One specific example of this SIS is that which is commercially supplied by JSR Co. under the trade name of JSR SIS, by Shell Chemical Co. under the trade name of Krayton D, etc. An example of SEPS is the one commercially supplied by Kuraray Co. under the trade name of Septon.

What can be exemplified as said polyolefin elastomer is a block copolymer derived by copolymerizing a highly crystalline polyolefin block such as polyethylene, polypropylene, etc. to constitute the rigid portion and a non-crystalline copolymer block to constitute the soft portion. Specifically, examples of such copolymer are a block copolymer comprising olefin polymer chain (crystalline)-copolymer chain with ethylene and butylene (noncrystalline)-olefin polymer chain (crystalline); a polypropylene-polyethylene oxide-poly propylene block copolymer; a polypropylene-polyolefin (noncrystalline)-polypropylene block copolymer; and a block copolymer comprising polypropylene-polyolefin (non-crystalline-polypropylene block copolymer; a block copolymer comprising styrene polymer chain, ethylene-butylene copolymer chain (noncrystalline) and olefin polymer chain (crystalline). One example is the one commercially supplied by JSR Co. under the trade name of DYNARON.

As a specific example of said polyester elastomer, there can be cited polybutylene terephthalate-polyether-poly-butylene terephthalate block copolymer, etc.

In cases where said thermoplastic elastomer is used as the component of the adhesive layer of the Adhesive Tape of the present invention, the ratio by which the thermo-plastic elastomer contained in the adhesive layer is typically 0 to 60% by weight, and preferably 5 to 50% by weight to the adhesive layer.

In order to enhance the adhesive properties as indicated in terms of the probe tack for the adhesive layer 2 in the Adhesive Tape of the present invention, the adhesive layer may be prepared by way of incorporating therein in addition to the α-olefin copolymer derived by co-polymerizing said three α-olefin components having from 2 to 12 carbon atoms another type of α-olefin copolymer. In this case, it is preferable that the total quantity of the copolymer comprising said three components, i.e., propylene, 1-butene, and α-olefin having from 5 to 12 carbon atoms and the another type of α-olefin copolymer contained in the adhesive layer is 50% by weight or more.

What is preferred for said another type of α-olefin copolymer is a copolymer derived by copolymerization of at least two types of α-olefin monomer selected from among ethylene, propylene, 1-butene and 1-hexene. As specific examples of such α-olefin copolymer, there can be cited ethylene-propylene copolymer, ethylene-1-butene co-polymer, ethylene-1-hexene copolymer, propylene-1-butene copolymer, propylene-1-hexene copolymer, 1-butene-1-hexene copolymer, etc. Specific examples of the copolymer in this category are those commercially supplied by Mitsui Chemicals, Inc. under the trade names of Tafmer A, Tafmer P, etc.

Said co-oligomer of ethylene with other α-olefin is a low-molecular weight copolymer of ethylene with other α-olefin which is in the liquid state at room temperature. Examples of said α-olefins are those α-olefins having from 3 to 20 carbon atoms such as propylene, 1-butene, 1-pentene, 1-hexene, 1-octene, 1-decene, 1-dodecene, 1-tetradecene, 1-hexadecene, 1-octadecene, 4-methyl-1-pentene, etc. What are preferred among said α-olefins are those α-olefins having from 3 to 14 carbon atoms. Said co-oligomers each have the structural unit represented by the following formula.

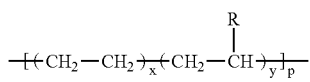

Wherein R is a hydrocarbon group represented by $C_nH_{2n+1}$ (n being a positive integral number), and x, y, and p are positive integral numbers.

Said co-oligomer has a number average molecular weight of typically 100 to 10,000, and preferably 200 to 5,000. The ethylene content of this co-oligomer is typically 30 to 70 mol. %, and preferably 40 to 60 mol. %.

In case said co-oligomer is used as a compositional element of the adhesive layer in the Adhesive Tape of the present invention, the ratio by which this co-oligomer is comprised in the adhesive layer is typically 0 to 20% by weight, and preferably 0 to 10% by weight.

In cases where said other α-olefin copolymer is used in addition to the α-olefin copolymer derived by copolymerizing the three types of α-olefins having from 2 to 12 carbon atoms as the compositional element of the adhesive layer for the Adhesive Tape of the present invention, such mode of use is advantageous since the glass transition temperature of the adhesive layer declines to the extent that the initial adhesion strength may be adjusted to within an optimum range and also adhesive properties at low temperature levels may be improved.

In cases where a mixed resin comprising said α-olefin copolymer and co-oligomer of ethylene with other α-olefin is used as the compositional element of the adhesive layer, such mode of use is advantageous since the glass transition temperature of the adhesive layer declines to the extent that the initial adhesion strength and viscosity may be adjusted to within an optimum range.

Furthermore in cases where a mixed resin comprising said α-olefin copolymer and a thermoplastic elastomer is used as the compositional element of the adhesive layer, such mode of use is advantageous since the glass transition temperature of the adhesive layer declines to the extent that the initial adhesion strength may be adjusted to within an optimum range and also adhesion properties at moderate temperature levels may be improved.

In addition to the α-olefin copolymer, the thermoplastic elastomer and the co-oligomer of ethylene with other α-olefin, the adhesive layer of the Adhesive Tape of the present invention may comprise various auxiliary components, such as plasticizers like liquid butyl rubber, tackifiers like polyterpene, etc. In case such auxiliary components are used that contain a functional group or an unsaturated bond, it is preferable that the type and quantity thereof be so adjusted that the adhesive layer will not augment time-related changes in the adhesion after the tape has been put in an intended use (due to heat, pressure, humidity, ultraviolet irradiation, etc.).

The adhesive layer in the Adhesive Tape of the present invention may contain various additives that are conventionally used in the raw material for this type of adhesive layer. For instance, various fillers, pigments, UV absorbers, antioxidants, heat stabilizers, lubricants, etc. may be contained therein.

The thickness of the adhesive layer in the Adhesive Tape of the present invention is typically 1 to 50 μm, and preferably 5 to 30 μm.

The thickness of the adhesive tape as a whole is typically 30 to 200 μm, and preferably 60 to 180 μm for the injury preventing properties, ease of application job, and pricing reasons.

The tensile modulus of the Adhesive Tape of the present invention is in the range of 100 to 500 MPa.

As for the adhesion of the Adhesive Tape of the present invention, it is preferable that the probe tack as determined in accordance with the procedure stipulated in the reference column of JIS Z0237 after the adhesive tape has been adjusted to within the range of 20 to 80° C. be in the range of 0.01 to 1 N/5 mm diam. Although the adhesion of the adhesive tape is measured with the tape attached to the adherend at a temperature of 23° C., it is preferable that the test specimen be heated and maintained in the temperature range of 20 to 80° C. with view to enhancing the tight adhesion to the adherend.

It is on the contrary not preferable that the probe tack declines to a level below 0.01 N/5 mm diam. for the reason that generation of chip fly may be hardly prevented under such condition. It is not so desirable that the probe tack be over 1 N/5 mm diam. since the pickup property is apt to be deteriorated at such a level. A probe tack over and above 0.01 N/5 mm diam. is thought to give favorable effects since secure adhesion may be achieved between the Adhesive Tape of the present invention and the wafer whereby chip fly is eliminated during the wafer processing step, the length of nick or crack and the percent nick and crack development are minimized, adhesion of dicing sawdust is eliminated, etc. A probe tack of 1 N/5 mm diam. or less gives good effects on the pickup property for reason that the chip may be readily peeled from the Adhesive Tape of the present invention.

In the stage where the Adhesive Tape of the present invention is peeled off after it has been applied, the adherend may be readily peeled from the tape even without utilizing such special device as will be required in the procedure using light or electron beam to cure the adhesive layer so as to impair the adhesion.

This adhesive tape does not leave 'left-over glue' on the chip after the chip has been peeled off. In other words, it does not cause adhesion of such substance that will disrupt the ensuing bonding and molding operations.

Figure 4:
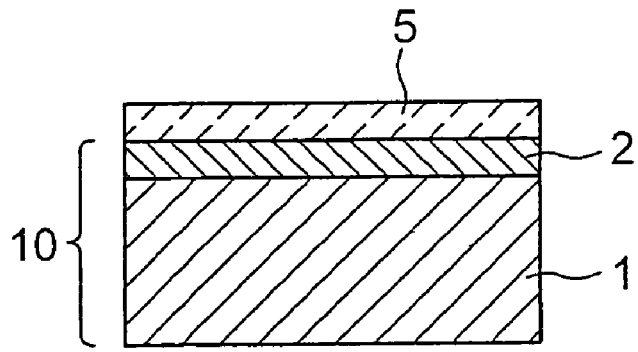
FIG. 4 shows a sectional view of wafer processing adhesive tape of the present invention illustrating another mode of embodiment thereof.

FIG. 4 shows a sectional view of the wafer processing Adhesive Tape of the present invention illustrating another embodiment thereof. As the Figure shows, the wafer processing adhesive tape 10 comprises the substrate layer 1, the adhesive layer 2 laminated on the substrate layer 1 and the release tape 5 provided on the adhesive layer 2 side.

Figure 5:
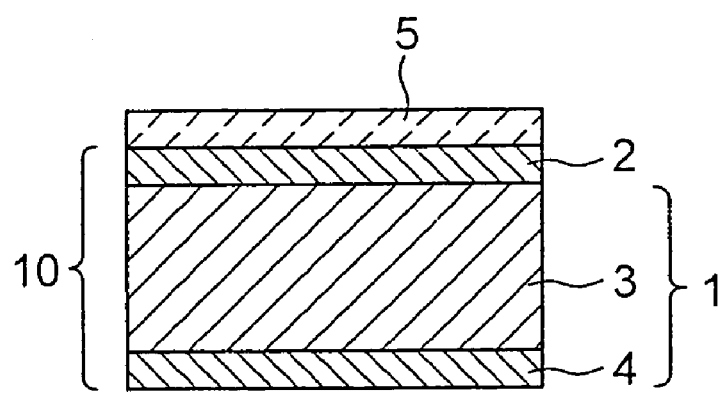
FIG. 5 shows a sectional view of wafer processing adhesive tape of the present invention illustrating another mode of embodiment thereof.

FIG. 5 shows a sectional view of the wafer processing adhesive tape of the present invention illustrating another embodiment thereof. As the Figure shows, the wafer processing adhesive tape 10 of the present invention comprises the substrate layer 1 constructed of the intermediate layer 3 and the surface layer 4 and the adhesive layer 2 laminated on the intermediate layer 3, wherein the release tape 5 is provided on the adhesive layer 2.

Figure 6:
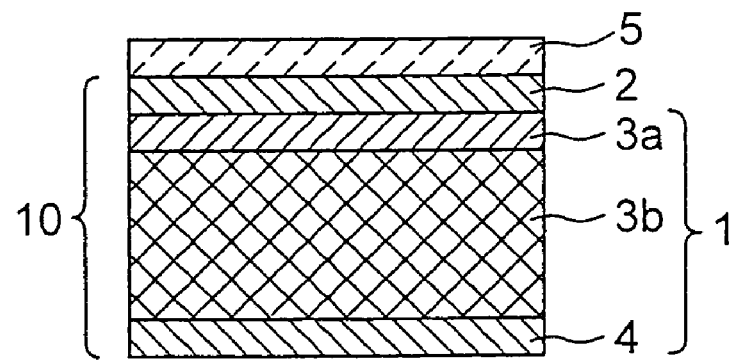
FIG. 6 shows a sectional view of wafer processing adhesive tape of the present invention illustrating another mode of embodiment thereof.

FIG. 6 shows a sectional view of the wafer processing adhesive tape of the present invention illustrating another embodiment thereof. As the Figure shows, the wafer processing adhesive tape 10 of the present invention comprises the substrate layer 1 constructed of the first intermediate layer 3a and the second intermediate layer 3b and the surface layer 4 and the adhesive layer 2 laminated on the first intermediate layer 3a, wherein the release tape 5 is provided on the adhesive layer 2.

Figure 7:
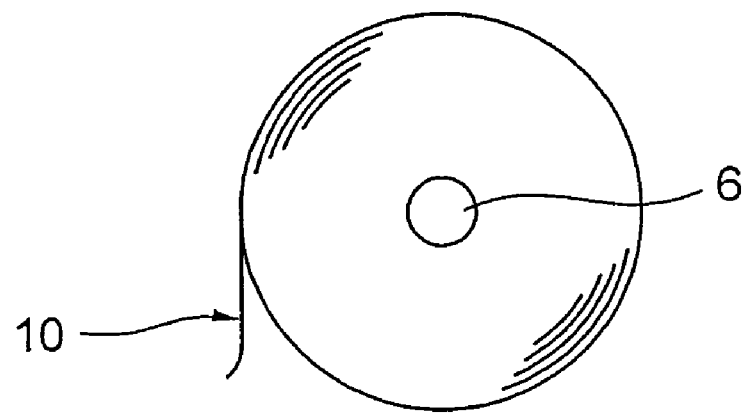
FIG. 7 shows a side view of wafer processing adhesive tape of the present invention illustrating a mode of its being wound up in a roll.
Figure 8:
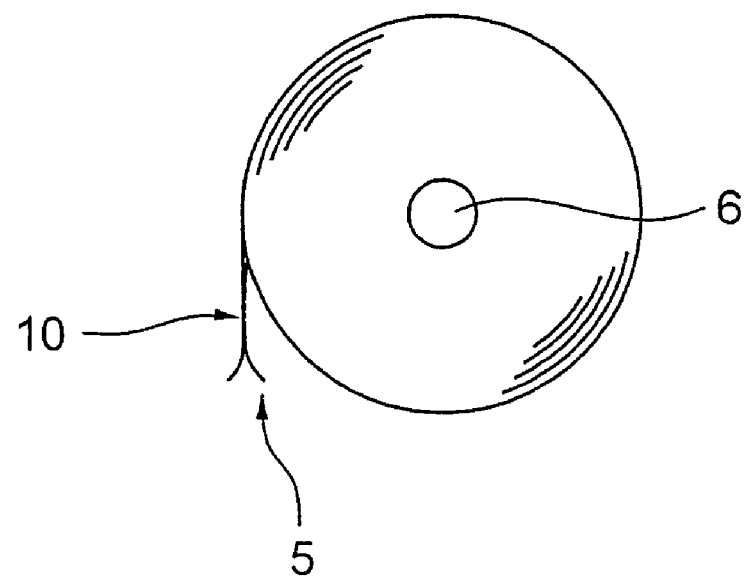
FIG. 8 shows a side view of wafer processing adhesive tape of the present invention illustrating another mode of its being wound up in a roll.

FIG. 7 shows the state in which the wafer processing adhesive tape 10 of the present invention is wound up in a roll 6. FIG. 8 shows the state in which the release tape 5 is attached onto the adhesive layer side of the wafer processing adhesive tape 10 of the present invention and wound up in the roll 6.

What is used for the release tape is, for example, a thermoplastic film having a release layer constructed of an UV curing type siloxane-derived crosslinked compound. For the reason that dents and protrusions on the surface of the release tape are embossed on the surface of the adhesive layer, it is desirable that the release tape is so much smooth as will give a surface coarseness of 1 µm or less. From the viewpoint of reducing the amount of waste to be disposed of, to an extent not affecting winding, it is preferable that the release tape be as thin as possible, say, 5 to 200 µm, and preferably 10 to 100 µm.

As for the method for manufacturing the Adhesive Tape of the present invention, it is manufactured by way of heating and melting the respective raw materials for the substrate layer (the surface layer and the intermediate layer) and the adhesive layer and co-extruding the prepared materials into a multilayer laminated film having a specified thickness. The manufacture is preferably executed at high production efficiency, in an energy-conserving manner and less expensively. The Adhesive Tape of the present invention may be manufactured in a melt extrusion laminating process wherein the adhesive layer is laminated on the substrate.

A Manufacturing Method of the present invention comprises producing an adhesive tape having the substrate layer constructed of one or a plurality of layers and the adhesive layer which is laminated on one side of such substrate layer. It is preferable that the adhesive tape is manufactured according to a co-extrusion process using a multilayer die in such manner that the melt flow rate (MFR) (as determined in accordance with ASTM D1238 at a temperature of 230° C. and under a load of 21.18 N) will be 5 to 40 g/10 min. and the difference in MFR between adjoining layers be 10 g/10 min. or less, and operating condition of which being such that the melting temperature is 200 to 260° C. and the difference in the melting temperature between adjoining layers be 30° C. or less.

As a few examples of the co-extrusion process using a multilayer die, there can be cited a process for adhering together the molten materials for the respective layers which are integrated in advance by combining all the molten materials in a stacked form and fed into the die (the teed block process); a process for firstly feeding the molten material of each layer into an individual manifold, secondly integrating all individual layers into a united body by jointing one layer to another in a common space in the die (conventionally upstream of the die lip inlet) and thirdly and finally feeding the unit and then feeding the integrated laminated material into a flat die (the multiple manifold process); and a hybrid process comprising a combination of the feed block process and the multiple manifold process.

It is preferable that said MFR be 5 to 40 g/10 min. and the difference in MFR between the joining layers be 10 g/10 min. or less for the reason that each layer constructed of different materials has uniform thickness and thus may be formed a multilayer structure having good surface characteristics. It is preferable that the melting temperature be 200 to 260° C. and the difference in the melting temperature between the adjoining layers be 30° C. or less for the reason that each layer constructed of different materials has uniform thickness and thus may be formed a multilayer structure having good surface characteristics which are free of generation of foreign matters.

A Method for Using of the present invention comprises a process for applying said wafer processing adhesive tape to the wafer under pressure at a temperature of 20 to 80° C., cutting the wafer into chips at a temperature of 15 to 35° C., stretching the obtained adhesive tape at a temperature of 40 to 80° C. and then peeling the chips from the adhesive tape by picking up the same at room temperature.

Any type of wafer may be acceptable so long as it is in the normal solid state. Examples of nonconductive material for the wafer are glass, ceramics, rigid plastics, etc. Examples of semiconductor are element semiconductor such as silicon, germanium, selenium and tellurium, or binary compound semiconductor such as GaAs, GaP and InSb, or ternary compound semiconductor such as AlGaAs, or quadruple compound semiconductor such as AlGaInAs, or metal oxide semiconductor such as $SnO_2$, $ZnO$, $TiO_2$ and $Y_2O_5$, or semiconductor constructed of other metal oxide. Wafers having a thickness of some ten µm to some mm, an area of some ten $mm^2$ to some tens of thousand $mm^2$ may be used. The wafer to be used may be in the round disk, square or oblong shape.

Tight adhesion may be achieved between the tape and the wafer without creating air pockets and the tape and the wafer may be kept from undergoing deterioration of their original qualities due to heating by means of adhering them to each other under pressure at a temperature of 20 to 80° C. So long as the wafer is cut into chips at a temperature of 15 to 35° C., the chip-to-chip intervals may be extended evenly without being accompanied by any tear initiated from the kerf in the tape when the adhesive tape is stretched at a temperature of 40 to 80° C., even if no special cooling or heating device is utilized.

In a preferred embodiment of the Method for Using of the present invention, said wafer is a wafer upon whose surface have been formed circuit patterns and said cutting operation is performed by dicing.

The Adhesive Tape of the present invention may be utilized as a surface protection sheet in the process of firstly forming kerfs whose depth is shallower than the thickness of the wafer from the surface of the wafer on whose front side have been printed circuit patters, secondly thinning the wafer by grinding its backside, and thirdly and finally grinding the backside of the wafer to divide the wafer into separate chips.

EXAMPLES

The present invention is further described with reference to examples, but it should be construed that the invention is in no way limited to those examples.

In the following examples and comparative examples, viscoelasticity, melt flow rate, probe tack, temperature-dependent adhesion, rewinding force, chip fly, nick and crack and the percent nick and crack development, contamination with dicing sawdust, stretchability and pickup properties are measured and evaluated in accordance with the following test methods, respectively.

(1) Viscoelasticity: Using a mechanical spectrometer RMS-800 manufactured by Rheometric Scientific Co. with a 8 mm diam. parallel plate and the gap between plates set at 1.5 mm, storage modulus G' (Pa) and loss modulus G" (Pa) values were measured at a frequency ($\omega$) of 100 radians/second and a rising temperature rate of 3° C./min. in the range of −50 to 350° C. A tan $\delta$ was calculated according to the formula tan $\delta$=G"/G' wherein G" is the measured loss modulus and G' is the measured storage modulus.

(2) Melt flow rate: The melt flow rate (MFR) was measured in accordance with the melt flow rate test procedure as stipulated in ASTM D1238 at a temperature of 230° C. and under a load of 21.18 N (2.16 kgf).

(3) Probe tack: The values of probe tack were measured in accordance with the procedure stipulated in the reference column of JIS Z0237-1991 using a probe tack tester MODEL TM1 manufactured by Toyo Seiki Co. The test was carried out by allowing a probe having a 5 mm diameter to contact the adhesive surface of the test specimen under a load of 10 gf for 10 seconds at a measuring temperature of 23° C. and relative humidity (RH) of 50%, and then the probe was peeled in the perpendicular direction at a speed of 10 mm/sec. to measure the force required to accomplish the peeling job (unit: N/5 mm diam.). Tests were repeated on 5 specimens, and an average value was recorded as the probe tack.

(4) Temperature-dependent adhesion force: Tests were carried out in accordance with the procedure for measuring adhesion force as stipulated in JIS Z0237-1991. Specimens were adhered to the mirror surface of silicon at a temperature of 23° C. After having allowing the adhered specimen to dwell in atmosphere maintained at 23° C. and 50° C., respectively, and then the specimens were tested for their peel strength at a 180° angle (unit: N/25 mm) so that the temperature-dependent adhesion force be evaluated with reference to the following criteria.

The specimen was rated acceptable if the ratio of (Adhesion force at 50° C.)/(Adhesion force at 23° C.) was 0.7 to 1.3, and "acceptance" was denoted by the code "OK".

The specimen was rated rejectable if the ratio of (Adhesion force at 50° C.)/(Adhesion force at 23° C.) was less than 0.7 or in excess of 1.3, and "rejection" was denoted by the code "NG".

(5) Rewinding force: Rewinding force was measured in accordance with the procedures for measuring high-speed rewinding force as stipulated in JIS Z0237-1991. The resisting force generated in the process of rewinding the wafer processing adhesive tape wound in a roll was rewound at a speed of 30 m/min. was reported as high-speed rewinding force (unit: N/25 mm).

(6) Chip fly: The silicon wafer (P type, thickness: 400 μm, diameter: 6 inch) was firmly fixed in place to the frame (MDFTF-2-6-1-H manufactured by Disco Corp.) with the wafer processing adhesive tape (the specimen) interposed in between using a mounter (HS-7800 manufactured by Hugle Electronics Co.) under three different conditions, namely, at application temperatures of 20° C., 40° C. and 60° C. Thereupon, the mounted wafer was placed in a dicer (DAD320 manufactured by Disco Corp.) and underwent dicing to chips of 0.50 mm and 1 mm square size which was performed using a blade (NBC-ZH-2500, size: 27HEDD) under the operating conditions of a revolving speed of 30,000 rounds per min. and a cutting speed of 70 mm/min., a full film cut depth of 30 μm, a cutting water (20° C. constant temperature water) feed rate of 1.5 L/min. from the nozzle to the wafer surface and 1.0 L/min. from the downcomer nozzle in the rotary blade.

Observation was made over all of the chips of 0.50 mm square or 1.0 mm square size obtained by dicing said silicon wafer at least at one application temperature out of the three application temperatures of 20° C., 40° C., and 60° C., and the evaluation was made by counting the number of chips which were scattered with reference to the following criteria. The specimen was rated acceptable if the ratio of scattered chips to the total number of chips was 0.3% or less for both 0.50 mm and 1.0 mm square sizes, and "acceptance" was denoted by the code "OK".

The specimen was rated tentatively acceptable if the ratio of scattered chips to the total number of chips was 0.3% or less for either one of 0.50 mm and 1.0 mm square sizes, and "closeness to acceptance" was denoted by the code "Nearly OK".

The specimen was rated rejectable if the ratio of scattered chips to the total number of chips was in excess of 0.3% for both 0.50 mm and 1.0 mm square sizes, and "rejection" was denoted by the code "NG".

(7) Length of nick or crack and the percent nick and crack development: The adhesive layer as the specimen of the wafer processing adhesive tape which was applied to the mirror surface of a silicon wafer (P type, thickness: 400 μm, finished coarseness: #2000, diameter: 6 inches) using a mounter (HS-7800 manufactured by Hugle Electronics Co.) at such application temperature that does not cause chip fly, and the silicon wafer was attached firmly to the frame (MDFTF-2-6-1-H manufactured by Disco Corp.) with the adhesive tape interposed in between. Thereupon, the mounted wafer was placed in a dicer (DAD320 manufactured by Disco Corp.) and underwent dicing which was performed using a blade (NBC-ZH-2500, size: 27HEDD) under the operating conditions of a revolving speed of 30,000 rounds per min. and a cutting speed of 70 mm/min., a full film cut depth of 30 μm, a cutting water (20° C. constant temperature water) feed rate of 1.5 L/min. from the nozzle to the wafer surface and 1.0 L/min. from the downcomer nozzle in the rotary blade. The series of operation from the application step using the mounter to the dicing step was carried out at a temperature of 23° C. in atmosphere controlled to relative humidity (RH) of 50%.

Nick or crack that could develop on the ground surface of the chip were measured, as FIG. 9 shows, so that the distance from the cut surface to the tip of nick or crack in the perpendicular direction be measured as the length of nick or crack, and the maximum value recorded was reported as the maximum nick or crack (unit: μm) which developed in the chip. As for the nick or crack which developed in the corner section, measurement was performed in the manner conceptually illustrated in FIGS. 10 and 11, respectively.

In case any nick or crack longer than 10 μm developed in the 3 mm square chips, such chip was counted as a chip having nick or crack, and the ratio of this number of chips to the total number of chips produced from a 6-inch wafer was termed the "percent nick and crack development (%)."

As the criteria by which to evaluate nonexistence of nick or crack, in the case where the ratio of the number of chips having the maximum length of nick or crack in the chip of 30 μm or shorter, and preferably 10 μm or shorter to the total number of 3 mm square size chips diced from a 6 inch-wafer (the percent acceptable chip production) was 90% or higher, it was deemed that nick or crack does not exist. Care should be taken about possible changes which may result from defects in the wafer per se or conditions of grinding done on the backside of the wafer. While the total number of chips was taken into account for the evaluation, it is desirable from the statistical point of view to use larger wafer or increase the number of wafers as the matrix for survey. Nevertheless, variances in nick and crack development was controlled by means of keeping conditions of the wafer and grinding done on the backside of the wafer at equal levels so that valid comparison may be made on the basis of chips obtained from a single 6 inch-diam. wafer.

(8) Contamination with dicing sawdust: A silicon wafer (P type, thickness: 400 μm, diameter: 6 inches) was attached firmly to the frame (MDFTF-2-6-1-H manufactured by Disco Corp.) with the wafer processing adhesive tape (the specimen) interposed in between using a mounter (HS-7800 manufactured by Hugle Electronics Co.) at such application temperature that does not cause IC chip fly. Thereupon, the mounted wafer was placed in a dicer (DAD320 manufactured by Disco Corp.) and underwent dicing which was performed using a blade (NBC-ZH-2500, size: 27HEDD) under the operating conditions of a revolving speed of 30,000 rounds per min. and a cutting speed of 70 mm/min., a full film cut depth of 30 μm, a cutting water (20° C. constant temperature water) feed rate of 1.5 L/min. from the nozzle to the wafer surface and 1.0 L/min. from the downcomer nozzle in the rotary blade. Thus was diced the wafer into 3 mm square size chips.

Next, all the 3 mm-square chips obtained by dicing a 6 inch-diam. wafer were viewed under an optical microscope (100 power) for observing presence/absence of dicing sawdust. Contamination with dicing sawdust was evaluated with reference to the following criteria by surveying the ratio of the number of chips carrying dicing sawdust to the total number of chips (the percent contamination). The specimen was rated acceptable if the percent contamination was 0.3% or less, and "acceptance" was denoted by the code "OK."

The specimen was rated rejectable if the percent contamination was in excess of 0.3%, and "rejection" was denoted by the code "NG."

(9) Stretchability: The silicon wafer (P type, thickness: 400 μm, diameter: 6 inches) was attached firmly to the frame (MDFTF-2-6-1-H manufactured by Disco Corp.) with the adhesive tape (the specimen) interposed in between using a mounter (HS-7800 manufactured by Hugle Electronics Co.) at such application temperature that does not cause chip fly. Thereupon, the mounted wafer was placed in a dicer (DAD320 manufactured by Disco Corp.) to undergo dicing which was performed using a blade (NBC-ZH-2500, size: 27HEDD) under the operating conditions of a revolving speed of 30,000 rounds per min. and a cutting speed of 70 mm/min., a full film cut depth of 30 μm, a cutting water (20° C. constant temperature water) feed rate of 1.5 L/min. from the nozzle to the wafer surface and 1.0 L/min. from the downcomer nozzle in the rotary blade. Thus was diced the wafer into 3 mm square size chips.

Next, the interval between one chip and another adhered to the adhesive tape was stretched on a wafer stretching machine (HS-1800 manufactured by Hugle Electronics Co.) by means of firstly heating the wafer processing adhesive tape which had undergone dicing and secondly pushing upwards the adhesive tape portion to which was adhered the wafer as far as a 20 mm travel distance with a round column (rod)-shaped pushing jig having a 180 mm diameter.

The stretchability was evaluated with reference to the criteria comprising the following three standards, i.e., (a), (b), and (c), and samples satisfying all the standards were determined to be acceptable (denoted by the code "OK") and samples which failed to satisfy all the standards were determined to be rejectable (denoted by the code "NG").

Standard (a): The thickness of the adhesive tape in contact with the tip of the pushing jig is 90% or more of the thickness of the area not in contact with the pushing jig, that is to say, the former does not cause any sag or "necking."

Standard (b): The stretched interval between chips is 200 μm or wider.

Standard (c): The ratio of the interval stretched in the longitudinal direction to the interval stretched in the transverse direction between chips is 0.7 or more and 1.3 or less.

(10) Pickup properties: The silicon wafer (P type, thickness: 400 μm, diameter: 6 inches) was attached firmly to the frame (MDFTF-2-6-1-H manufactured by Disco Corp.) with the wafer processing adhesive tape (the specimen) interposed in between using a mounter (HS-7800 manufactured by Hugle Electronics Co.) at such application temperature that does not cause chip fly. Thereupon, the mounted wafer was placed in a dicer (DAD320 manufactured by Disco Corp.) to undergo dicing which was performed using a blade (NBC-ZH-2500, size: 27HEDD) under the operating conditions of a revolving speed of 30,000 rounds per min. and a cutting speed of 70 mm/min., a full film cut depth of 30 μm, a cutting water (20° C. constant temperature water) feed rate of 1.5 L/min. from the nozzle to the wafer surface and 1.0 L/min. from the downcomer nozzle in the rotary blade. Thus was diced the wafer into 3 mm square size chips. Additionally, if the adhesive tape was of the UV-curing type, the adhesive tape was exposed to UV irradiation (total amount of irradiation: approx. 360 mJ/cm$^2$) for 60 seconds using an UV irradiation apparatus (DUV100 manufactured by Disco Corp.).

Furthermore, the wafer processing adhesive tape which had undergone dicing was heated to a temperature of 60° C. and thus was stretched the chip-to-chip interval using a pick-and-place equipment (DE35 manufactured by Hugle Electronics Co.). Thereupon, after the lapse of 0.3 second from the push-up of the pin, the percent capturability (%) as surveyed under the pickup conditions was recorded, and the pickup property was evaluated with reference to the following standards. If all of the 49 chips in 1 tray were picked up in 3 cycles of picking up operation, the specimen was rated acceptable (denoted by the code of "OK") and if the chips were not picked up completely, the specimen was rated rejectable (denoted by the code of "NG").

Example 1

Figure 12:
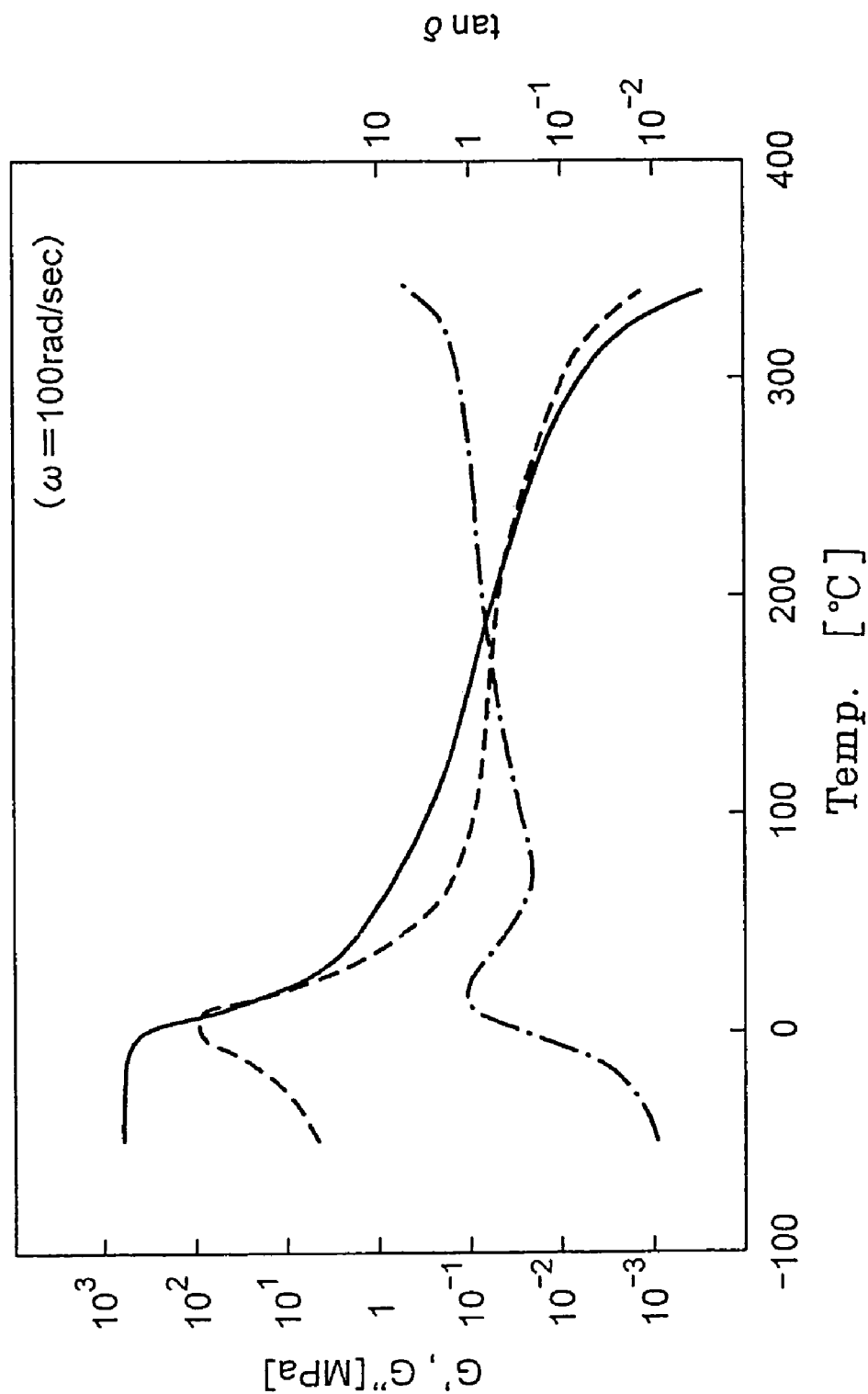
FIG. 12 shows test results on storage modulus G', loss modulus G" and tan δ of an adhesive layer.

The following materials were used as the raw materials for the respective layers constituting the adhesive tape 10. As the components to constitute the substrate layer 1, 80 parts by weight of propylene-ethylene-1-butene random copolymer (r-PP) (consisting of 5 mol. % of ethylene, 5 mol. % of 1-butene) and 20 parts by weight of styrene-ethylene-butylene-styrene block copolymer (SEBS) (Taftec™ H1052 manufactured by Asahi Chemical Industry Co.) were used. As the components to constitute the adhesive layer 2, 100 parts by weight of propylene-1-butene-4-methyl-1-pentene copolymer (PB(4-MP)) (consisting of 50 mol. % of propylene, 20 mol. % of 1-butene, and 30 mol. % of 4-methyl-1-pentene) was used. FIG. 12 shows the storage modulus G', loss modulus G", and tan δ of the adhesive layer which were measured in accordance with the aforesaid procedure for measuring said viscoelasticity.

The melt flow rate of each layer was adjusted to 15 g/10 min. for the adhesive layer and 15 g/10 min. for the substrate layer by mixing a plurality of lots of a same type of resin having different melt flow rate values. Next, the raw material for each layer was melted on an extruder equipped with the full flight type screw. The forming conditions are that melting temperature for the adhesive layer was 230° C. and for the substrate layer was 230° C., and these molten resins for the two layers were laminated one layer over the other through a multi-layer die at a co-extruding temperature of 230° C. After the extruded adhesive tape was cooled, a release tape (Tohcello Separator™ SP T-18, thickness: 37 μm manufactured by Tohcello Co.) was provided on the adhesive layer and then the resulting product was wound up after being slit to an intended width.

The resulting adhesive tape was comprised of the substrate layer consisting of a single layer and the adhesive layer, wherein a release tape was provided on the adhesive layer side. The thickness of each layer was 20 μm for the adhesive layer and 70 μm for the substrate layer, thus making a total thickness of 90 μm.

The probe tack of the obtained wafer processing adhesive tape was 0.1 N/5 mm diam. at an application temperature of 60° C., 0.01 N/5 mm diam. at 40° C., and 0 N/5 mm diam. at 20° C. Consequently, 60° C. was deemed to be the optimum application temperature.

As for the temperature-dependent peel adhesion force at an angle of 180°, it was 1 N/25 mm at a testing temperature of 23° C. and 1 N/25 mm at 50° C. In light of a value of 1 as calculated according to the equation [(The peel adhesion force at 50° C.) (The peel adhesion force at 23° C.)], there was not confirmed any dependence on the temperature.

As for the force required to rewind from the roll, it was found to be 0.05 N/25 mm, and the roll was rated to be light and easy to be handled. The aforesaid measurements are shown in Table 3.

Furthermore, in order to evaluate the processability of the obtained wafer processing adhesive tape, tests were carried out to determine chip fly, the maximum length of nick or crack and the percent nick and crack development, contamination with dicing sawdust, stretchability and the pickup property with the adhesive tape heated to a temperature of 60° C. and adhered to the wafer. The test results are shown in Table 4.

As for the chip fly, the phenomenon of chips scattering did not occur, and thus was demonstrated nonoccurrence of defective chip production due to chip fly.

As for the maximum length of nick or crack and the percent nick and crack development, the test results indicated virtually comparable levels with the levels achieved according to the wax-fixing method (the maximum length of nick or crack is 5 μm or less, and the percent nick and crack development is 0%).

As for the contamination with dicing sawdust, there was not observed any dicing sawdust carried on the chip.

As for the stretchability, the standard (a) was 98%, the standard (b) was 400 μm, and the standard (c) was 1.1 with the result that the adhesive tape fulfilled all of the standards. Thus was demonstrated its excellent stretchability.

As for the pickup property, all of the chips were peeled off and there was no straggling chip due to failure to pick up. Thus was demonstrated its excellent pickup property.

Example 2

For the raw materials for the respective layers constituting the adhesive tape 10, 80 parts by weight of the same r-PP as used in Example 1 and 20 parts by weight of hydrogenated styrene-isoprene-styrene block copolymer (SEPS) (Septon™ 2063 manufactured by Kuraray Co. Ltd.) were used as the components of the substrate layer 1. As the components of the adhesive layer 2, 95 parts by weight of the same PB(4-MP) as used in Example 1 and 5 parts by weight of ethylene-α-olefin co-oligomer (LEO) (Lucant™ HC-20 manufactured by Mitsui Chemicals, Inc.) were used. The test results covering the viscoelasticity of the adhesive layer are shown in Table 3 for the three different temperature levels of 15° C., 25° C. and 35° C.

Under the conditions shown in Table 1, an adhesive tape was formed in a same manner as employed in Example 1. After providing a release tape (Tohcello Separator™ SP T-18, thickness: 37 μm manufactured by Tohcello Co.) on the adhesive layer, the adhesive tape was slit to an intended width and wound up.

Results of measurement/evaluation of the obtained wafer processing adhesive tape are shown in Table 3 and Table 4, respectively.

Example 3

For the raw materials for the respective layers constituting the adhesive tape 10, low-density poly-ethylene (LDPE) (density: 0.92 g/cm$^3$) was used as the component of the surface layer 4 in the substrate layer 1. As the components of the intermediate layer 3 in the substrate layer 1, 80 parts by weight of the same r-PP as used in Example 1 and 20 parts by weight of hydrogenated styrene-isoprene-styrene block copolymer (SEPS) (Septon™ 2063 manufactured by Kuraray Co. Ltd.) were used. As the components of the adhesive layer 2, 80 parts by weight of the same PB(4-MP) as used in Example 1, 5 parts by weight of LEO, and 15 parts by weight of styrene-isoprene-styrene block copolymer (SIS) (SIS5229N manufactured by JSR Co.) were used.

An adhesive tape was formed in accordance with the same procedure as in Example 1 under the operating conditions shown in Table 1, except that the surface layer and intermediate layer were included and the co-extrusion temperature was set at 220° C. After providing a release tape (Tohcello Separator™ SP T-18, thickness: 37 μm manufactured by Tohcello Co.) on the adhesive layer, the resulting adhesive tape was slit to an intended width and wound up.

Results of measurement/evaluation of the obtained wafer processing adhesive tape are shown in Table 3 and Table 4, respectively.

Example 4

For the raw materials for the respective layers constituting the adhesive tape 10, the same LDPE as used in Example 3 was used as the component of the surface layer 4 in the substrate layer 1, and 90 parts by weight of the same r-PP as used in Example 1 and 10 parts by weight of hydrogenated styrene-butadiene copolymer (HSBR) (DYNARON™ 1321P manufactured by JSR Co.) were used as the components of the intermediate layer 3 in the substrate layer 1. As the components of the adhesive layer 2, 60 parts by weight of the same PB(4-MP) as used in Example 3, 15 parts by weight of SIS, 5 parts by weight of LEO, and 20 parts by weight of ethylene-propylene copolymer (EP-A) (density: 0.87 g/cm$^3$) were used.

An adhesive tape was formed in accordance with the same procedure as in Example 1 under the operating conditions shown in Table 1. After providing a release tape (Tohcello Separator™ SP T-18, thickness: 37 μm manufactured by Tohcello Co.) on the resulting adhesive layer, the adhesive tape was slit to an intended width and wound up.

Results of measurement/evaluation of the obtained wafer processing adhesive tape are shown in Table 3 and Table 4, respectively.

Example 5

For the raw materials for the respective layers constituting the adhesive tape 10, as the components of the surface layer 4 in the substrate layer 1, 95 parts by weight of the same LDPE as used in Example 3 and 5 parts by weight of metal ion crosslinked resin of ethylene-methacrylic acid copolymer (Ionomer) (HI-MILAN™ 1652 manufactured by DuPont-Mitsui Polychemicals, Ltd.) were used. As the components of the intermediate layer 3 in the substrate layer 1, 80 parts by weight of the same r-PP as used in Example 4 and 10 parts by weight of HSBR, and 10 parts by weight of high-density polyethylene (HDPE) (density: 0.96 g/cm$^3$) were used. As the components of the adhesive layer 2, 50 parts by weight of the same PB(4-MP) as used in Example 3, 15 parts by weight of SIS, 5 parts by weight of LEO, and 30 parts by weight of polyolefin crystalline block-(ethylene-butylene copolymer block)-polyolefin crystalline block copolymer (CEBC) (DYNARON™ 6200P manufactured by JSR Co.) were used.

An adhesive tape was formed in accordance with the same procedure as in Example 1 under the operating conditions shown in Table 1 and the resulting adhesive tape was slit to an intended width and wound up.

Results of measurement/evaluation of the obtained wafer processing adhesive tape are shown in Table 3 and Table 4, respectively.

Example 6

For the raw materials for the respective layers constituting the adhesive tape 10, 85 parts by weight of the same LDPE as used in Example 5, 5 parts by weight of Ionomer, and 10 parts by weight of ethylene-methacrylic acid copolymer (EMAA) (NUCREL™ N1108C manufactured by DuPont-Mitsui Polychemicals, Ltd.) were used as the components of the surface layer 4 in the substrate layer.

As the components of the intermediate layer 3 in the substrate layer 1, 60 parts by weight of said LDPE, 20 parts by weight of said EMAA, and 20 parts by weight of the same EP-A as used in Example 4 were used. As the components of the adhesive layer 2, 40 parts by weight of the same PB(4-MP) as used in Example 4, 30 parts by weight of EP-A, 20 parts by weight of SIS, and 10 parts by weight of LEO were used.

An adhesive tape was formed in accordance with the same procedure as in Example 1 under the operating conditions shown in Table 1 and the resulting adhesive tape was slit to an intended width and wound up.

Results of measurement/evaluation of the obtained wafer processing adhesive tape are shown in Table 3 and Table 4, respectively.

Example 7

For the raw materials for the respective layers constituting the adhesive tape 10, the same LDPE as used in Example 3 was used as the component of the surface layer 4 in the substrate layer. As the components of the intermediate layer 3 in the substrate layer 1, 15 parts by weight of the same HSBR as used in Example 4 and 85 parts by weight of the same r-PP as used in Example 1 were used. As the components of the adhesive layer 2, 50 parts by weight of the same PB(4-MP) as used in Example 4, 30 parts by weight of EP-A, and 20 parts by weight of the same CEBC as used in Example 5 were used.

An adhesive tape was formed in accordance with the same procedure as in Example 1 under the operating conditions shown in Table 1, and after a release tape (Tohcello Separator™ SP T-18, thickness: 37 μm manufactured by Tohcello Co.) was provided on the adhesive layer and then the resulting product was wound up after being slit to an intended width.

Results of measurement/evaluation of the obtained wafer processing adhesive tape are shown in Table 3 and Table 4, respectively.

Example 8

For the raw materials for the respective layers constituting the adhesive tape 10, the same LDPE as used in Example 3 was used as the component of the surface layer 4 in the substrate layer 1. As the components of the intermediate layer 3 in the substrate layer 1, 90 parts by weight of the same r-PP as used in Example 1 and 10 parts by weight of the same CEBC as used in Example 5 were used. As the components of the adhesive layer 2, 40 parts by weight of the same PB(4-MP) as used in Example 4, 35 parts by weight of EP-A, 20 parts by weight of SIS, and 5 parts by weight of LEO were used.

An adhesive tape was formed in accordance with the same procedure as in Example 1 under the operating conditions shown in Table 1, and after a release tape (Tohcello Separator™ SP T-18, thickness: 37 μm manufactured by Tohcello Co.) was provided on the adhesive layer and then the resulting product was wound up after being slit to an intended width.

Results of measurement/evaluation of the obtained wafer processing adhesive tape are shown in Table 3 and Table 4, respectively.

Example 9

For the raw materials for the respective layers constituting the adhesive tape 10, 90 parts by weight of the same LDPE as used in Example 6 and 10 parts by weight of EMAA were used as the components of the surface layer 4 and the first intermediate layer 3a in the substrate layer 1. As the components of the second intermediate layer 3b in the substrate layer 1, 60 parts by weight of the same r-PP as used in Example 7 and 40 parts by weight of HSBR were used. As the components of the adhesive layer 2, 85 parts by weight of the same PB(4-MP) as used in Example 3, 10 parts by weight of SIS, and 5 parts by weight of LEO were used.

An adhesive tape was formed in accordance with the same procedure as in Example 1 under the operating conditions shown in Table 1, and the resulting adhesive tape was wound up after being slit to an intended width.

Results of measurement/evaluation of the obtained wafer processing adhesive tape are shown in Table 3 and Table 4, respectively.

Example 10

For the raw materials for the respective layers constituting the adhesive tape 10, the same LDPE as used in Example 3 was used as the components of the surface layer 4 and the first intermediate layer 3a in the substrate layer 1. As the components of the second intermediate layer 3b in the substrate layer 1, 60 parts by weight of linear low-density polyethylene (LLDPE) (density: 0.94 g/cm$^3$) and 40 parts by weight of ethylene-vinylacetate copolymer (EVA) (EVAFLEX™ P-1407 manufactured by DuPont-Mitsui Polychemicals, Ltd.) were used. As the components of the adhesive layer 2, 80 parts by weight of the same PB(4-MP) as used in Example 5, 15 parts by weight of CEBC, and 5 parts by weight of LEO were used.

An adhesive tape was formed in accordance with the same procedure as in Example 1 under the operating conditions shown in Table 1, and after a release tape (Tohcello Separator™ SP T-18, thickness: 37 μm manufactured by Tohcello Co.) was provided on the adhesive layer and then the resulting product was wound up after being slit to an intended width.

Results of measurement/evaluation of the obtained wafer processing adhesive tape are shown in Table 3 and Table 4, respectively.

Comparative Example 1

<An Example of Pressure-sensitive Adhesive Agent>

A polyvinyl chloride (PVC) film having a 70 μm thickness was prepared as the substrate layer of the adhesive tape. An acrylic adhesive agent was prepared by preparing a solution containing an acrylate copolymer having a number average molecular weight of 300,000 derived by co-polymerizing in toluene 70 parts by weight of methyl acrylate, 30 parts by weight of butyl acrylate and 5 parts by weight of acrylic acid, and then adding thereto a urethane oligomer by the ratio of 70 parts by weight against 100 parts by weight of said acrylate copolymer and a multifunctional isocyanate compound by the ratio of 5 parts by weight against 100 parts by weight of said acrylate copolymer. Thereupon, the resulting acrylic adhesive preparation was applied to one side of said PVC film, and the resulting film was heated for 3 min. at a temperature of 130° C. for building thereon an adhesive layer of a 15 μm thickness. Results of measurement/evaluation of the obtained adhesive tape are shown in Table 3 and Table 4, respectively.

Comparative Example 2

<Another Example of Pressure-sensitive Adhesive Agent>

The same polyvinyl chloride (PVC) film as used in Comparative Example 1 was prepared as the substrate layer of the adhesive tape. A polyester adhesive agent was prepared by preparing a solution containing a polyester copolymer having a number average molecular weight of 580,000 derived by copolymerizing in toluene 80 parts by weight of polycarbonate diol, 20 parts by weight of adipic acid, and 0.5 parts by weight of dibutyltin oxide, and then adding thereto a multifunctional isocyanate compound by the ratio of 5 parts by weight against 100 parts by weight of said polyester. Thereupon, the resulting polyester adhesive preparation was applied to one side of said PVC film, and the resulting film was heated for 3 min at a temperature of 130° C. for building thereon an adhesive layer of a 15 μm thickness. Results of measurement/evaluation of the obtained adhesive tape are shown in Table 3 and Table 4, respectively.

Comparative Example 3

<Another Example of Pressure-sensitive Adhesive Tape>

The same polyvinyl chloride (PVC) film as used in Comparative Example 1 was prepared as the substrate layer of the adhesive tape. An acrylic adhesive agent was prepared by preparing a solution containing an acrylate copolymer having a number average molecular weight of 500,000 derived by copolymerizing in toluene 90 parts by weight of butyl acrylate, 5 parts by weight of acrylonitrile and 5 parts by weight of acrylic acid, and then adding thereto a multifunctional acrylic monomer by the ratio of 50 parts by weight against 100 parts by weight of said polyacrylate copolymer, a multifunctional isocyanate compound by the ratio of 5 part by weight against 100 parts by weight of said polyacrylate copolymer, and a photopolymerization initiator by the ratio of 5 part by weight against 100 parts by weight of said polyacrylate copolymer. Thereupon, the resulting acrylic adhesive preparation was applied to one side of said PVC film, and the resulting film was heated for 3 min at a temperature of 130° C. for building thereon an adhesive layer of a 15 μm thickness. Then it was treated with ultraviolet light irradiation by retaining for 60 sec. under high-pressure mercury vapor lamp of 80 W/cm$^2$ and an adhesive tape was obtained. Results of measurement/evaluation of the obtained adhesive tape are shown in Table 3 and Table 4, respectively.

Comparative Example 4

<An Example of UV-curing Type Adhesive Agent>

Using an ethylene-methyl methacrylate copolymer (EMMA) (methyl methacrylate content: 10% by weight, melting point: 100° C.) having a thickness of 80 μm as the substrate layer, an adhesive preparation prepared by mixing 100 parts by weight of acrylate copolymer (n-butyl acrylate-acrylic acid copolymer), 120 parts by weight of urethane acrylate oligomer having a molecular weight of 8,000, 10 parts by weight of a curing agent (diisocyanate-derived) and 5 parts by weight of a UV curing initiator (benzophenone-derived) together was applied to the substrate layer so as to build an adhesive layer of 10 μm thickness thereon. Results of measurement/evaluation of the obtained adhesive tape are shown in Table 3 and Table 4, respectively.

Comparative Example 5

<Another Example of UV-curing Type Adhesive Agent>

Using an ethylene-methyl methacrylate copolymer (EMMA) (methyl methacrylate content: 10% by weight, melting point: 100° C.) having a thickness of 140 μm as the substrate layer, an adhesive preparation prepared by mixing 100 parts by weight of acrylate copolymer (n-butyl acrylate-acrylic acid copolymer), 70 parts by weight of urethane acrylate oligomer having a molecular weight of 8,000, 5 parts by weight of a curing agent (diisocyanate-derived) and 5 parts by weight of a UV curing initiator (benzophenone-derived) together was applied to the surface of said substrate layer so as to build an adhesive layer of 10 μm thickness thereon. Results of measurement/evaluation of the obtained adhesive tape are shown in Table 3 and Table 4, respectively.

INDUSTRIAL APPLICABILITY

The wafer processing adhesive tape of the present invention renders it may reduce the size of the nick or crack in the wafer in the course of the cutting operation performed by dicing the wafer to 30 μm or less and also to reduce the percentage of development of nick and crack. Consequently, production of off-quality chips may be oppressed in the stage of processing the wafer. Besides, the wafer may be cut without using any special equipment such as light curing or electron beam curing devices.

According to the Manufacturing Method of the present invention, the multi-layered adhesive tape of the present invention demonstrating evenness in the thickness of the respective layers constructed of different materials and good surface characteristics may be produced without being accompanied by generation of foreign matters to any significant extent and with high productivity by simple manufacturing processes.

According to the Method for Using the wafer processing adhesive tape of the present invention, the chips may be peeled from the adhesive tape of the present invention without using any special equipment designed to lower the adhesion force.

TABLE 1

| | Attaching of Release Tape Yes or No | Adhesive Layer Component: Wt. ratio Thickness(T): μm MFR: g/10 min. | | Substrate Layer Constituting Component: Weight ratio Thickness(T): μm, MFR: g/10 min. | | | | | |
|---|---|---|---|---|---|---|---|---|---|
| | | | | Intermediate Layer | | | | | |
| | | | | First Intermediate Layer | | Second Intermediate Layer | | Surface Layer | |
| Example 1 | Yes | PB(4MP) | 100 | r-PP | 80 | | | | |
| | | | | SEBS | 20 | | | | |
| | | T = 20, MFR = 15 | | T = 70, MFR = 15 | | | | | |
| Example 2 | Yes | PB(4MP) | 95 | r-PP | 80 | | | | |
| | | LEO | 5 | SEPS | 20 | | | | |
| | | T = 20, MFR = 15 | | T = 40, MFR = 18 | | | | | |
| Example 3 | Yes | PB(4MP) | 80 | r-PP | 80 | | | LDPE | 100 |
| | | SIS | 15 | SEPS | 20 | | | | |
| | | LEO | 5 | | | | | | |
| | | T = 10, MFR = 20 | | T = 60, MFR = 19 | | | | T = 10, MFR = 15 | |
| Example 4 | Yes | PB(4MP) | 60 | r-PP | 90 | | | LDPE | 100 |
| | | EP-A | 20 | HSBR | 10 | | | | |
| | | SIS | 15 | | | | | | |
| | | LEO | 5 | | | | | | |
| | | T = 15, MFR = 16 | | T = 50, MFR = 16 | | | | T = 15, MFR = 15 | |
| Example 5 | No | PB(4MP) | 50 | r-PP | 80 | | | LDPE | 95 |
| | | CEBC | 30 | HSBR | 10 | | | Ionomer | 5 |
| | | SIS | 15 | HDPE | 10 | | | | |
| | | LEO | 5 | | | | | | |
| | | T = 15, MFR = 11 | | T = 50, MFR = 12 | | | | T = 15, MFR = 12 | |
| Example 6 | No | PB(4MP) | 40 | LDPE | 60 | | | LDPE | 85 |
| | | EP-A | 30 | EMAA | 20 | | | Ionomer | 5 |
| | | SIS | 20 | EP-A | 20 | | | EMAA | 10 |
| | | LEO | 10 | | | | | | |
| | | T = 15, MFR = 26 | | T = 100, MFR = 26 | | | | T = 15, MFR = 17 | |
| Example 7 | Yes | PB(4MP) | 50 | r-PP | 85 | | | LDPE | 100 |
| | | EP-A | 30 | HSBR | 15 | | | | |
| | | CEBC | 20 | | | | | | |
| | | T = 12, MFR = 10 | | T = 50, MFR = 10 | | | | T = 15, MFR = 10 | |
| Example 8 | Yes | PB(4MP) | 40 | r-PP | 90 | | | LDPE | 100 |
| | | EP-A | 35 | CEBC | 10 | | | | |
| | | SIS | 20 | | | | | | |
| | | LEO | 5 | | | | | | |
| | | T = 15, MFR = 7 | | T = 50, MFR = 8 | | | | T = 15, MFR = 7 | |
| Example 9 | No | PB(4MP) | 85 | LDPE | 90 | r-PP | 60 | LDPE | 90 |
| | | SIS | 10 | EMAA | 10 | HSBR | 40 | EMAA | 10 |
| | | LEO | 5 | | | | | | |
| | | T = 15, MFR = 20 | | T = 15, MFR = 12 | | T = 50, MFR = 10 | | T = 15, MFR = 12 | |
| Example 10 | Yes | PB(4MP) | 80 | LDPE | 100 | LLDPE | 60 | LDPE | 100 |
| | | CEBC | 15 | | | EVA | 40 | | |
| | | LEO | 5 | | | | | | |
| | | T = 15, MFR = 18 | | T = 15, MFR = 15 | | T = 85, MFR = 12 | | T = 15, MFR = 15 | |

* "Yes" denotes "with Release Tape", "No" denotes "without Release Tape"

TABLE 2

| | Wafer Processing Adhesive Tape | | |
|---|---|---|---|
| | Attaching of Release Tape Yes or No | Adhesive Layer Constituting Component: Weight ratio Thickness (t): μm | Substrate Layer Component: Wt. ratio Thickness (t): μm |
| Comparative Example 1 (Pressure Sensitive Type) | Yes | Acrylate copolymer 100<br>Methyl acrylate 70<br>Butyl acrylate 30<br>Acrylic acid 5<br>Urethane oligomer 70<br>Multifunctional isocyanate compound 5<br>t = 15 | PVC 100<br>t = 70 |
| Comparative Example 2 (Pressure Sensitive Type) | Yes | Polyester type 100<br>Polycarbonate diol 80<br>Adipic acid 20<br>Dibutyltin oxide 0.5<br>Multifunctional isocyanate compound 5<br>t = 15 | PVC 100<br>t = 70 |
| Comparative Example 3 (Pressure Sensitive Type) | Yes | Acrylate Copolymer 100<br>Butyl acrylate 90<br>Acrylnitrile 5<br>Acrylic acid 5<br>Multifunctional acrylic monomer 50<br>Multifunctional isocyanate Compound 5<br>Photopolymerization initiator 5<br>t = 15 | PVC 100<br>t = 70 |
| Comparative Example 4 (UV-curing Type) | Yes | Acrylate Copolymer 100<br>n-Butyl acrylate<br>Acrylic acid<br>Urethane oligomer 120<br>Isocyanate compound 10<br>UV curing initiator 5<br>t = 10 | EMMA 100<br>t = 80 |
| Comparative Example 5 (UV-curing Type) | Yes | Acrylate Copolymer 100<br>n-Butyl acrylate<br>acrylic acid<br>Urethane oligomer 70<br>Isocyanate compound 5<br>UV curing initiator 5<br>t = 10 | EMAA 100<br>t = 140 |

* "Yes" denotes "with Release Tape", "No" denotes "without Release Tape"

TABLE 3

| | Viscoelasticity | | | | | | Probe Tack (N/5 mm-diam.) Application Temperature | | | Peel Adhesion Force at 180° (N/25 mm) against silicon mirror wafer | | | Rewind Force (N/25 mm) |
|---|---|---|---|---|---|---|---|---|---|---|---|---|---|
| | Storage Modulus G' (MPa) | | | tan δ (G''/G') | | | | | | Test temperature | | Adhesion Ratio | |
| | 15° C. | 25° C. | 35° C. | 15° C. | 25° C. | 35° C. | 20° C. | 40° C. | 60° C. | 23° C. | 50° C. | 50° C./23° C. | |
| Example 1 | 50 | 9 | 4 | 0.8 | 1 | 0.7 | 0 | 0.01 | 0.1 | 1 | 1 | 1 | 0.05 |
| Example 2 | 40 | 8 | 3 | 0.7 | 0.7 | 0.6 | 0.1 | 0.2 | 0.2 | 1 | 1 | 1 | 0.1 |
| Example 3 | 15 | 6 | 2 | 0.4 | 0.3 | 0.2 | 0.3 | 0.3 | 0.3 | 2 | 2 | 1 | 0.3 |
| Example 4 | 10 | 5 | 2 | 0.2 | 0.2 | 0.1 | 0.5 | 0.5 | 0.5 | 3 | 3 | 1 | 0.5 |
| Example 5 | 7 | 3 | 1 | 0.1 | 0.05 | 0.1 | 0.7 | 0.8 | 0.9 | 7 | 8 | 1.1 | 1.5 |
| Example 6 | 12 | 6 | 3 | 0.2 | 0.1 | 0.1 | 0.8 | 0.9 | 1.0 | 10 | 14 | 1.2 | 2.0 |
| Example 7 | 10 | 5 | 2 | 0.1 | 0.08 | 0.08 | 0.6 | 0.6 | 0.7 | 6 | 7 | 1.2 | 0.7 |
| Example 8 | 8 | 3 | 1 | 0.1 | 0.06 | 0.08 | 0.5 | 0.6 | 0.6 | 4 | 4 | 1 | 0.8 |
| Example 9 | 20 | 6 | 2 | 0.3 | 0.3 | 0.2 | 0.2 | 0.2 | 0.2 | 2 | 2 | 1 | 1.0 |
| Example 10 | 30 | 7 | 3 | 0.5 | 0.4 | 0.3 | 0.3 | 0.3 | 0.3 | 2 | 2 | 1 | 0.2 |
| Compar. Example 1 | 6 | 1 | 0.4 | <0.01 | <0.01 | <0.01 | 0.5 | 0.7 | 1.3 | 5 | 9 | 1.8 | 0.5 |
| Compar. Example 2 | 0.5 | 0.1 | <0.1 | <0.01 | <0.01 | <0.01 | 0.7 | 0.8 | 1.2 | 7 | 10 | 1.4 | 0.5 |
| Compar. | 0.9 | 0.3 | <0.1 | <0.01 | <0.01 | <0.01 | 0.8 | 1.1 | 1.6 | 6 | 12 | 2.0 | 0.5 |

TABLE 3-continued

| | Viscoelasticity | | | | | | Probe Tack (N/5 mm-diam.) | | | Peel Adhesion Force at 180° (N/25 mm) against silicon mirror wafer | | | Rewind Force |
|---|---|---|---|---|---|---|---|---|---|---|---|---|---|
| | Storage Modulus G' (MPa) | | | tan δ (G"/G') | | | Application Temperature | | | Test temperature | | Adhesion Ratio | |
| | 15° C. | 25° C. | 35° C. | 15° C. | 25° C. | 35° C. | 20° C. | 40° C. | 60° C. | 23° C. | 50° C. | 50° C./23° C. | (N/25 mm) |
| Example 3 Compar. Example 4 | <0.1 | <0.1 | <0.1 | <0.01 | <0.01 | <0.01 | 2 | 1.8 | 1.2 | 15 | 6 | 0.4 | 1.5 |
| Compar. Example 5 | <0.1 | <0.1 | <0.1 | <0.01 | <0.01 | <0.01 | 1.5 | 1.2 | 1.0 | 10 | 6 | 0.6 | 1.0 |

TABLE 4

| | Chip Fly | | Nick (*) or Crack Test | | Contamination | | |
|---|---|---|---|---|---|---|---|
| | Application Temperature (° C.) | Rating | Size of Nick or Crack (μm) | Percent Nick & Crack Development (%) | With Dicing Sawdust | Stretchability | Pickup Property |
| Example 1 | 60 | OK | 3 | 0 | OK | OK | OK |
| Example 2 | 40 | OK | 4 | 0 | OK | OK | OK |
| Example 3 | 20 | OK | 8 | 0 | OK | OK | OK |
| Example 4 | 20 | OK | 10 | 0 | OK | OK | OK |
| Example 5 | 20 | OK | 23 | 0 | OK | OK | OK |
| Example 6 | 20 | OK | 18 | 0 | OK | OK | OK |
| Example 7 | 20 | OK | 16 | 0 | OK | OK | OK |
| Example 8 | 20 | OK | 20 | 0 | OK | OK | OK |
| Example 9 | 20 | OK | 9 | 0 | OK | OK | OK |
| Example 10 | 20 | OK | 6 | 0 | OK | OK | OK |
| Compar. Example 1 | 20 | NG | 40 | 35 | NG | OK | NG |
| Compar. Example 2 | 20 | OK | >50 | 90 | OK | OK | NG |
| Compar. Example 3 | 20 | Nearly OK | >50 | 60 | NG | OK | NG |
| Compar. Example 4 | 20 | Nearly OK | >50 | 100 | OK | NG | OK |
| Compar. Example 5 | 20 | Nearly OK | >50 | 100 | OK | OK | OK |

(*) "Nick" as used in this Table means "chipping or partial fragmentation" which would develop in IC chip.

What we claim is:

1. A method of using a wafer processing adhesive tape which comprises:
   adhering a wafer processing adhesive tape to a wafer under a load at a temperature of 20 to 80° C., said wafer processing adhesive tape comprising an adhesive layer on one side of a substrate layer wherein the storage modulus G' of the adhesive layer at a temperature of 15 to 35° C. is 1 MPa or more and wherein the adhesive layer comprises at least one type of α-olefin copolymer comprising at least two α-olefins having 2 to 12 carbon atoms as a principal component;
   cutting the wafer into chips at a temperature of 15 to 35° C.;
   stretching said wafer processing tape at a temperature of 40 to 80° C.; and
   thereupon peeling the chips from said wafer processing adhesive tape at room temperature.

2. A method for using a wafer processing adhesive tape according to claim 1, wherein said wafer is a wafer on whose front surface has been formed circuit patterns and said cutting is performed by dicing.

3. A method for using a wafer processing adhesive tape according to claim 1, wherein said adhesive layer has a tan δ of 0.05 or more as a ratio of a loss modulus G" to the storage modulus G' at a temperature of 15 to 35° C.

4. A method of using a wafer processing adhesive tape according to claim 1, wherein said adhesive layer contains 5 to 50% by weight of a thermoplastic elastomer.

* * * * *